United States Patent [19]

George

[11] 3,924,192

[45] Dec. 2, 1975

[54] MULTIBAND RANDOM CHANNEL ADDRESS CRYSTAL-LOCK TUNING SYSTEM

[75] Inventor: John Barrett George, Indianapolis, Ind.

[73] Assignee: RCA Corporation, New York, N.Y.

[22] Filed: June 3, 1974

[21] Appl. No.: 476,081

[52] U.S. Cl. .................................. 325/470; 325/459

[51] Int. Cl.$^2$ .................................. H04B 1/32

[58] Field of Search ........... 334/15, 16, 29; 331/19, 331/177 R, 178; 325/418, 421, 459, 464, 469, 470

[56] References Cited

UNITED STATES PATENTS

| | | | |
|---|---|---|---|
| 3,736,513 | 5/1973 | Wilson | 331/19 X |
| 3,798,553 | 3/1974 | Sakamoto | 325/421 X |
| 3,822,405 | 7/1974 | Sakamoto | 325/470 X |
| 3,846,707 | 11/1974 | Sakamoto et al. | 334/15 X |

*Primary Examiner*—Benedict V. Sufourek
*Attorney, Agent, or Firm*—Eugene M. Whitacre

[57] ABSTRACT

A television tuning system wherein voltage tunable tuners are supplied with a tuning voltage suitable for receiving a particular selected channel. The tuning voltage is produced by a sweep generator. A harmonic generator produces harmonically related reference signals at frequencies corresponding to television channel oscillator frequencies. A frequency discriminator produces an output representative of frequency differences between the oscillator signal and each of the harmonically related signals as said tuning is varied. A counter coupled to the discriminator produces an output count representative of the oscillator signal passing through a predetermined frequency relationship with respect to each of the harmonically related signals. A channel selector produces a stored count representative of a selected television channel. A comparator provides a hold signal to the sweep generator in response to a match between the output count and the stored count. A decoder identifies the presence of a first and a second particular output count. A band switch produces a signal to condition the voltage tunable tuners for reception of a first band of radio frequencies when the output count is less than or equal to a first particular count and to condition the voltage tunable tuners for reception of a second band of radio frequencies when the output count is greater than the first particular count. The band switch also conditions the voltage tunable tuners for reception of a third band of radio frequencies when the output count is greater than the second particular count. The sweep generator is reset, in response to a match between the output count and the first or second particular count, to a condition suitable for initiating variation of the tuning of the local oscillators through a fifth or sixth band of frequencies, respectively.

44 Claims, 9 Drawing Figures

MULTIBAND RANDOM CHANNEL ADDRESS CRYSTAL-LOCK TUNING SYSTEM

BACKGROUND OF THE INVENTION

This invention relates to a tuning system for a television receiver and more particularly to direct address channel selection in a tuner which is responsive to a varying tuning voltage, the voltage being scanned in a predetermined manner through a range of voltages for tuning any one of a plurality of television channels in a plurality of radio frequency bands.

Some prior art tuning systems for use with a voltage tunable tuner have utilized a plurality of preset potentiometers each adjusted to supply a voltage required to tune the tuner to a desired channel. Mechanical or electronic switches have been employed to connect one of the preset voltages at a time to the tuner. With this method of tuning, the channel being received is not accurately identified by the system. Initially, in order to set each of the potentiometers to permit reception of desired channels, a viewer must determine the channel being received by channel call letters and/or channel number identification periodically transmitted from the television station. Typically, after the channel being received has been identified, a plastic insert having the channel number printed thereon is placed in front of a lamp which will be illuminated whenever this channel is selected.

Other systems for tuning voltage tunable apparatus have proposed the use of a harmonic generator to provide a plurality of harmonically related signals throughout the band of frequencies to be tuned by the voltage tunable tuner. The tuner is provided with a tuning voltage that varies in a predetermined manner and causes the tuner to sweep through the band of frequencies to be tuned in a predetermined sequence. A sample of the local oscillator signal of the tuner is mixed with the plurality of harmonically related signals. Each time a frequency coincidence or a predetermined frequency difference occurs between the oscillator signal and one of the plurality of harmonically related signals, an output signal is derived. A counter is employed to cound the number of such occurrences and thereby provide an indication of the channel to which the tuner is tuned.

Heretofore, tuning systems utilizing a harmonic generator have only provided for tuning in one band of frequencies (such as the UHF band of channels 14–83 employed in the United States). In such a band of frequencies, the fixed oscillator frequencies associated with the channels are similarly spaced (e.g. by 6 MHz) throughout the band. These systems have used the harmonics produced by a harmonic generator as a reference for maintaining the oscillator of the tuner at one of the plurality of fixed frequencies. These systems, however, have not provided for identification and tuning of channels in two or more bands of frequencies wherein the required oscillator frequencies in the various bands are not regularly spaced.

SUMMARY OF THE INVENTION

In accordance with the present invention, a television tuning system includes a tuning means for receiving radio frequency signals corresponding to any one of a plurality of television channels in at least first and second bands of frequencies and having tunable local oscillator means for producing a corresponding oscillator signal in at least fourth and fifth bands of frequencies.

A sweep generator means is coupled to the oscillator means for varying the tuning thereof in a predetermined manner through at least the fourth and fifth bands of frequencies. A signal generating means produces harmonically related reference signals at frequencies corresponding to television channel oscillator frequencies in the third and fourth bands. A frequency discriminator means which has first and second inputs coupled to the oscillator means and to the harmonic generating means, respectively, produces an output signal representative of frequency differences between the oscillator signal and each of the harmonically related signals as said tuning is varied. Counting means which are coupled to the discriminator means produces an output count representative of the oscillator signal passing through a predetermined frequency relationship with respect to each of the harmonically related signals. Channel selector means which has an output terminal produces at the output terminal a stored count representative of a selected television channel. Comparator means which is coupled to the counting means and to the channel selector means provides a hold signal to the sweep generator means in response to a match between the output count and the stored count. A decoder means which is coupled to the counting means identifies the presence of a particular output count. A bandswitch means produces a band selection signal to condition the tuning means for reception of the first band of radio frequencies when the output count is less than or equal to the particular count and to condition the tuning means for reception of the second band of radio frequencies when the output count is greater than the particular count. Means resets the sweep generating means, in response to a match between the output count and the particular count, to a condition suitable for initiating variation of the tuning of the oscillator means through the fourth band of frequencies.

BRIEF DESCRIPTION OF THE DRAWING

The various aspects of the invention will be more readily apparent from a consideration of the following description when taken in connection with the accompanying drawing, in which.

GENERAL SYSTEM DESCRIPTION

Figure 1:
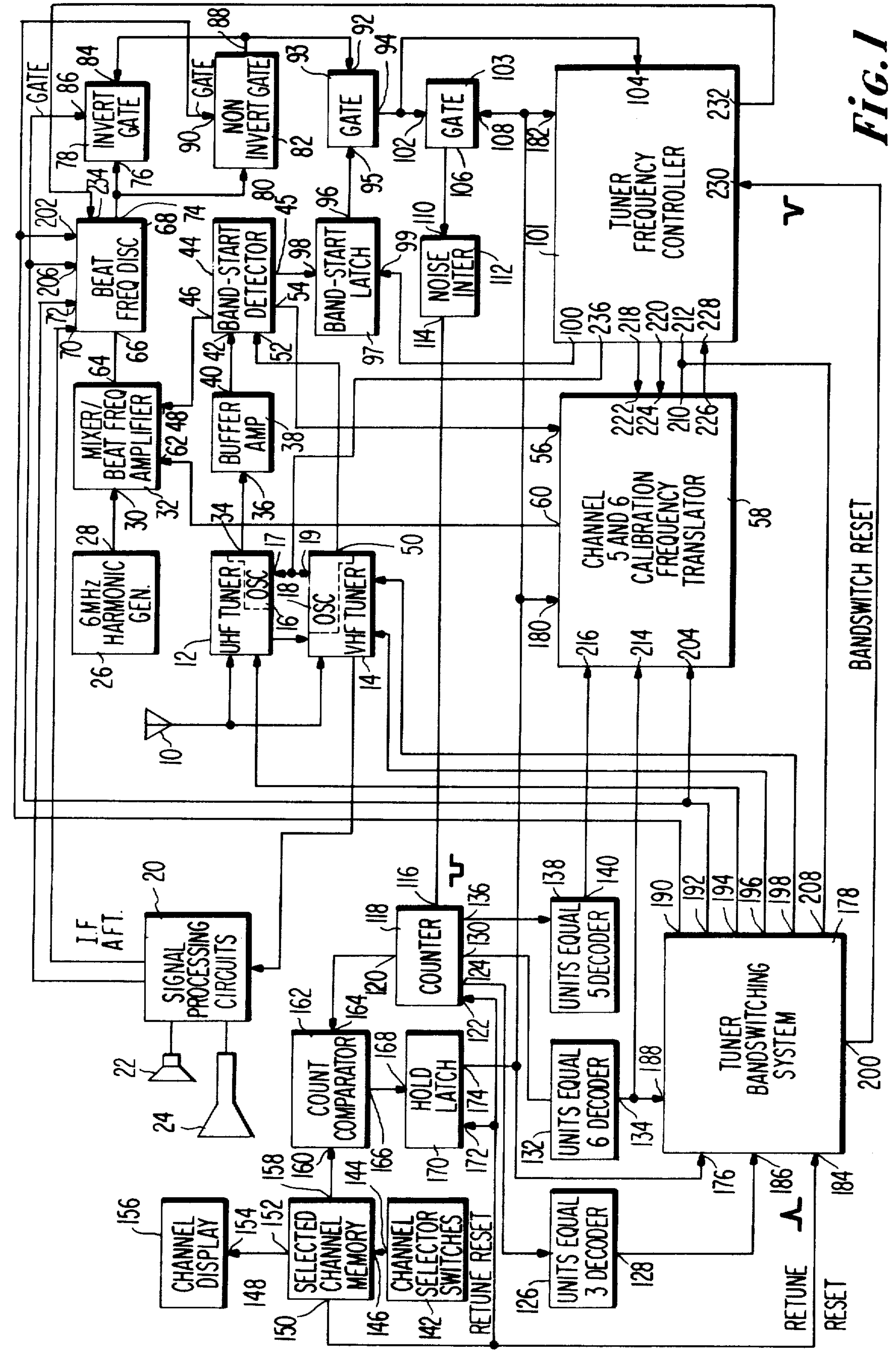
FIG. 1 illustrates in block form a television receiver including a tuning system constructed in accordance with the present invention.

As an aid to understanding the invention, a particular system as shown in block form in FIG. 1 will be described under several headings labeling the general functions of the several parts of the system. Subsequently, the various parts of the system will be described in further detail. The system will be described in the context of the channel allocations employed in the United States. However, it should be realized that the invention is of general applicability and may be employed when different channel allocations exist. In the latter instance, appropriate modifications to particular circuit configurations could be made while following the teachings of the invention.

Stated briefly, the overall tuning system to be described functions to provide a direct address to any particular televsision channel, for example, in the VHF and UHF signal bands employed in the United States. A viewer-operated channel selector switch or other device provides a signal representative of the selected channel, which signal is stored and which initiates operation of the tuner control circuits. The oscillator of the tuner being controlled is swept from a low frequency to a higher frequency, and a sample of the oscillator frequency is compared continuously in a frequency discriminator to a plurality of harmonically related signals. A pulse is produced by this comparison process each time a signal derived from the oscillator and one harmonic are in predetermined relation. The pulses are accumulated in a counter and are compared to the stored selected channel information in pursuit of a match of information. When a match occurs, the sweeping process is stopped and the oscillator frequency is stabilized with respect to the nearest harmonic of 6 MHz while utilizing an automatic fine tuning (AFT) correction signal to determine the differential frequency which is maintained between the oscillator signal and the nearest harmonic of 6 MHz, thereby keeping the system tuned to the frequency of a transmitted signal.

VOLTAGE TUNABLE TUNERS

In this portion of the overall system, VHF and UHF frequencies are intercepted, selected, amplified and converted to a uniform intermediate frequency (IF). The IF is then processed to recover audio and video modulation for reproduction by a kinescope and a speaker in a conventional manner.

To this end, an antenna 10, which provides for the interception of radio frequency (RF) signals, is coupled to a voltage tunable ultra high frequency (UHF) tuner 12 and a voltage tunable very high frequency (VHF) tuner 14. The VHF and UHF tuners 14 and 12, for example, may be of the KRK-155 and KRK-160 types shown in RCA Television Service Data, 1971 No. T13, published by RCA Corporation, 600 North Sherman Drive, Indianapolis, Indiana 46201. The UHF tuner 12 provides for the amplification and conversion of radio frequency signals (470–890 MHz – channels 14–83) into intermediate frequency (IF) signals. A UHF voltage controllable local oscillator 16 of the UHF tuner provides a UHF oscillator signal (517–931 MHz) to provide for the aforementioned UHF signal conversion.

The VHF tuner 14 provides for the amplification and conversion of RF signals (at frequencies of 54–72, 76–88, 174–216 MHz corresponding to channels 2–4, 5–6 and 7–13, respectively) into IF signals. A VHF voltage controllable local oscillator 18 of the VHF tuner provides a VHF oscillator signal (101–113, 123–129 and 221–257 MHz) to provide for the aforementioned VHF signal conversion.

The UHF tuner 12 is coupled to the VHF tuner 14 to provide for amplification by the VHF tuner of IF signals generated in the UHF tuner when the UHF channels are selected. The VHF tuner 14 is coupled to conventional signal processing circuits 20 which process the IF signals. A speaker 22 is coupled to signal processing circuits 20 and provides for the reproduction of audio information. A kinescope 24 is also coupled to signal processing circuits 20 and provides for the reproduction of video information.

OSCILLATOR FREQUENCY COMPARISON SYSTEM

In this portion of the overall system, a sample of the tuner oscillator signal is mixed with harmonically related signals produced by a 6 MHz harmonic generator. A beat or difference frequency produced by the mixing process is converted into a voltage level by a beat frequency discriminator.

A 6 MHz harmonic generator 26 generates harmonically related signals at 6 MHz intervals throughout the range of the UHF oscillator signal and the VHF oscillator signal. The harmonic signals are present at a terminal 28 of harmonic generator 26 and are coupled to a terminal 30 of a mixer/beat frequency amplifier 32. A sample of the output signal of the UHF local oscillator 16, present at terminal 34, is coupled to a terminal 36 of a buffer amplifier 38. The buffer amplifier prevents the harmonic signals from being coupled back to the UHF tuner 12 and thereby prevents the harmonic signals from interfering with the operation of the UHF tuner 12. The output terminal 40 of the buffer amplifier 38 is coupled to terminal 42 of a bandstart detector 44. The bandstart detector produces a pulse at a terminal 45 when the UHF oscillator signal is at a predetermined frequency which is in close proximity to the local oscillator frequency corresponding to channel 14. An output terminal 46 of the bandstart detector 44, having the sample of the UHF oscillator signal thereon, is coupled to a terminal 48 of the mixer/beat frequency amplifier 32.

A sample of the VHF oscillator signal of the VHF local oscillator 18 present at terminal 50 is coupled to a terminal 52 of the bandstart detector 44. The bandstart detector produces a pulse at the terminal 45 when the VHF oscillator signal is at either of two predetermined frequencies which are in a predetermined proximity to local oscillator frequencies corresponding to channels 2 and 7. An output terminal 54 of bandstart detector 44, having the sample of the VHF oscillator signal thereon, is coupled to a terminal 56 of a channel 5 and channel 6 calibration frequency translator 58. An output terminal 60 of the channel 5 and channel 6 calibration frequency translator 58 is coupled to a terminal 62 of the mixer/beat frequency amplifier 32. The channel 5 and 6 calibration frequency translator 58 provides for mixing of the VHF oscillator signal with a signal from a 52 MHz oscillator included in translator 58 when the VHF tuner 14 is tuned to channel 5 or 6 and channel 5 or 6 has been selected.

The mixer/beat frequency amplifier 32 is capable of producing a beat frequency or difference frequency signal including the difference between the tuner oscillator frequency and each of the harmonically related output frequencies of generator 26. In order to identify the particular one of the harmonics which corresponds to the oscillator frequency at any given instant, the amplifier 32 (as will be explained subsequently) includes a filter having an upper frequency limit of the order of 3 MHz. Since the harmonic signal separation if 6 MHz, only one dominant beat frequency output will be present at a time. An output terminal 64 of mixer/beat frequency amplifier 32 is coupled to a terminal 66 of a beat frequency discriminator 68 which provides an output voltage which, for example, is zero volts for beat frequencies greater than a predetermined range of frequencies, is a positive voltage for beat frequencies less than the predetermined range of frequencies, and changes substantially linearly in level within the predetermined range of frequencies.

The aforementioned predetermined frequency range is typically centered around 1 MHz and extends each side thereof in accordance with selected component parameters in the discriminator circuit. An output signal of a conventional automatic fine tuning portion of the signal processing circuits 20 is coupled to a terminal 70 and a terminal 72 of the beat frequency discriminator 68 to vary the center frequency of the predetermined range of frequencies of the discriminator 68 so as to maintain a desired IF signal condition in the signal processing circuits 20.

CHANNEL ADDRESS AND COUNT COMPARISON

In this portion of the overall system, the accumulated count of a counter, representative of the number of times a count is produced by beat frequency discriminator 68, is compared to a selected channel memory which contains stored information relating to a channel selected by an operator by means of an array of channel selector switches or other channel selection apparatus. When a match occurs between the count of the counter and the information in the selected channel memory, a voltage transition occurs at the output of a count comparator.

A counter 118 counts the number of pulses occurring at a terminal 116. A total pulse count is available at a terminal 120. The counter 118 is resettable to zero by means of a retune reset pulse applied to a terminal 122. In order to identify that the tuner (UHF or VHF depending on the band being tuned) is passing through certain channels, decoders 126, 132 and 138 are coupled to counter 118. Specifically, terminal 124 of counter 118 is coupled to a units-equals-three decoder 126. The units-equals-three decoder provides two different voltage outputs at a terminal 128 when the units digit of the total pulse count of the counter 118 equals three and when the units digit is other than three.

A terminal 130 of counter 118 is coupled to a units-equals-six decoder 132. Similar to decoder 126, different voltage outputs are provided at a terminal 134 of the decoder 132 when the units digit of the total pulse count of the counter 118 equals six as compared to when the digit is other than six. Furthermore, a terminal 136 of counter 118 is coupled to a units-equals-five decoder 138 which provides different outputs at a terminal 140 when the units digit of the total pulse count of counter 118 equals five and is other than five.

Channel selector switches 142 provide, in response to selection by a viewer, a signal representative of the channel selected. A terminal 144 of the channel selector switches 142 is coupled to a terminal 146 of a selected channel memory 148 which stores a tens digit and a units digit of the channel selected. Memory 148 also provides a retune reset pulse at a terminal 150 upon the completion of the selection of a complete channel number (e.g., tens and units). A terminal 152 of the selected channel memory is coupled to a terminal 154 of a channel display element 156. The channel display 156 provides a visual identification of the channel stored in the memory 148.

The selected channel information is coupled from a terminal 158 to a terminal 160 of a count comparator 162. The terminal 120 of counter 118 is coupled to a terminal 164 of count comparator 162. When the selected channel information at terminal 160 and the indicated channel information at terminal 164 are equal, a voltage transition is coupled from a terminal 166 of count comparator 162 to a terminal 168 of a hold latch 170. The retune reset terminal 150 of selected channel memory 148 is coupled to a terminal 172 of hold latch 170. The hold latch 170 has two stable states which are reflected by two different voltage conditions at terminal 174, one of which exists after a positive retune reset pulse has occurred at terminal 172 and the other of which exists after the voltage transition indicative of a channel "match" has occurred at terminal 168. The terminal 174 of hold latch 170 is coupled to a terminal 176 of tuner bandswitching system 178 to determine when the output of decoder 126 and decoder 132 will control band-switching, to a terminal 180 of channel 5 and 6 calibration frequency translator 58 to determine when the output of decoder 132 and decoder 138 will control frequency translation, and to a terminal 182 of tuner frequency controller 101.

COUNTER GATING CIRCUITRY

In this portion of the overall system, a series of gates are utilized to determine when voltage level changes produced at the output of a beat frequency discriminator will advance the count of a counter.

A terminal 74 of beat frequency discriminator 68 is coupled to a terminal 76 of an invert gate 78 and a terminal 80 of a non-invert gate 82. The invert gate 78 provides at a terminal 84 an inverted version of the voltage at terminal 74 of beat frequency discriminator 68 when a gate signal is present at terminal 86. A terminal 88 of non-invert gate 82 provides a non-inverted version of the voltage at the terminal 74 of beat frequency discriminator 68 when a gate signal exists at a terminal 90.

The terminals 84 and 88, respectively, are coupled to a terminal 92 of a gate 93. Signals existing at terminal 92 are coupled to terminal 94 of gate 93 when a gate signal exists at a terminal 95. A terminal 96 of a bandstart latch 97 is coupled to terminal 95 of gate 93. The bandstart latch 97 has two stable states which are controlled by signals present at a terminal 98 and a terminal 99. The terminal 98 is coupled to terminal 45 of bandstart detector 44. The terminal 99 is coupled to a terminal 100 of a tuner frequency controller 101. The terminal 94 of gate 93 is coupled to a terminal 102 of a gate 103 and a terminal 104 of the tuner frequency controller 101. Signal existing at terminal 102 of gate 103 is coupled to terminal 106 of gate 103 when a zero gate signal is present at a terminal 108.

Terminal 106 of gate 103 is coupled to a terminal 110 of a noise integrator 112. A terminal 114 of noise integrator 112 is coupled to a terminal 116 of a counter 118. Noise integrator provides for an elimination of noise which could falsely trigger counter 118.

VHF-UHF BAND SELECTION

In this portion of the overall system, supply voltages are switched to the VHF tuner and the UHF tuner in a manner necessary to sequence the tuner circuits from low band VHF (channels 2–6) to high band VHF (channels 7–13) and finally to UHF (channels 14–83). Also, a bandswitch reset pulse is developed at each of the points of transition between the aforementioned bands and is utilized to reset a tuner frequency controller and a bandstart latch.

The retune reset terminal 150 of selected channel memory 148 is coupled to a terminal 184 of tuner band-switching system 178 to provide for a reset of the tuner bandswitching system at the beginning of each tuning sequence. Tuner bandswitching system 178, in turn, provides at a terminal 200 a bandswitch reset pulse to a tuner frequency controller 101 which will be described subsequently. This pulse is provided when a return reset pulse occurs, when a transition occurs between low VHF channels and high VHF channel, when a transition occurs between VHF and UHF, or when B+ is turned on. Furthermore, the terminal 128 of units-equals-three decoder is coupled to a terminal 186 of the tuner bandswitching system to provide data required to switch from the high VHF band to the UHF band. The terminal 134 of units-equals-six decoder is coupled to a terminal 188 of the tuner bandswitching system to provide data required to switch from the low VHF to the high VHF band. The tuner bandswitching system provides for a switching of voltage on terminals 190, 192, 194, 196 and 198 in accordance with the input data supplied to terminals 184, 186, 176 and 188 to provide sequencing of the pertinent portions of the system first through low VHF channels 2–6, then high VHF channels 7–13, and finally UHF channels 14–83, after a reset pulse on terminal 184.

To this end, the terminals 190 through 198 of the tuner bandswitching system 178 are connected as follows: 190 to a terminal 202 of beat frequency discriminator 68 and terminal 90 of non-invert gate 82; 192 coupled to a terminal 204 of channel 5 and 6 calibration frequency translator 58, a terminal 206 of beat frequency discriminator 68, and terminal 86 of invert gate 78; 194 coupled to UHF tuner 12; 196 coupled to VHF tuner 14, and 198 coupled to VHF tuner 14. A terminal 208 is coupled to a terminal 210 of channel 5 and 6 calibration frequency translator 58 and to a terminal 212 of tuner frequency controller 101 to provide a common reference voltage between tuner bandswitching system 178, channel 5 and 6 calibration frequency translator 58 and tuner frequency controller 101.

CHANNEL 5 AND 6 CALIBRATION FREQUENCY TRANSLATOR

In this portion of the overall system, the sample of VHF oscillator signal coupled to a mixer/beat frequency amplifier is caused to shift in frequency when the channel selected is 5 or 6 and the count in a counter reaches "05" or "06". This operation is required in view of the fact that the local oscillator frequencies required for tuning channels 5 and 6 (in the U.S.) are not spaced from adjacent channel oscillator frequencies by integral multiples of 6 MHz. A similar technique may be employed where frequency allocations in a particular country result in irregularly spaced oscillator frequencies.

In the system, terminal 134 of the units-equals-six decoder 132 and the terminal 140 of the units-equals-five decoder 138 are coupled to a terminal 214 and a terminal 216, respectively, of the channel 5 and 6 calibration frequency translator 58. Supply voltages for the operation of a bistable circuit in the channel 5 and 6 calibration frequency translator are coupled from a terminal 218 and a terminal 220 of tuner frequency controller 101 to a terminal 222 and a terminal 224, respectively, of channel 5 and 6 calibration frequency translator 58. An output terminal 226 of the channel 5 and 6 calibration frequency translator is coupled to a terminal 228 of tuner frequency controller 101. The channel 5 and 6 calibration frequency translator 58 operates so that the frequency of the signal appearing at terminal 60 is shifted relative to the frequency of the local oscillator signal appearing at terminal 56 whenever the voltages at terminals 180, 204, 214 and 216 are representative of the existence of a local oscillator frequency of tuner 14 corresponding to either channel 5 or 6 and a corresponding selection of channel. Under all other conditions of voltage at terminals 180, 204, 214 and 216, the frequency of the signal appearing at terminal 60 is the same as the frequency of the signal appearing at terminal 56. Translator 58 also provides two different voltage levels at terminal 226 to signify whether the local oscillator frequency corresponds to one of the channels 5 and 6 or to some other channel.

TUNER FREQUENCY CONTROLLER

In this portion of the overall system, a voltage required to control the frequency of the oscillator signal of the VHF tuner or the UHF tuner is developed.

A terminal 230 of tuner frequency controller 101 is coupled to terminal 200 of tuner bandswitching system 178. A terminal 232 of the tuner frequency controller 101 is coupled to a terminal 234 of beat frequency discriminator 68. A terminal 236 of tuner frequency controller 101 is coupled to UHF oscillator 16 and VHF oscillator 18.

The tuner frequency controller 101 provides a repetitive range of voltage at terminal 236 which is made to scan in a predetermined manner to a more positive level in response to an appropriate voltage at terminal 182 and to stop scanning when an appropriately different voltage is provided at terminal 182. The change in voltage at terminal 236 causes the frequency of the appropriate local oscillator to vary in a predetermined manner. When the voltage at terminal 236 is not being scanned, variations in the discriminator output voltage resulting from a change in IF frequency are coupled to terminal 104 and provide for small amounts of change of the voltage at terminal 236 to correct the IF frequency. A reset of the voltage at terminal 236 to an initial condition occurs when the bandswitch reset voltage is applied to terminal 230. At the same time, an output pulse occurs at terminal 100. A voltage at terminal 232 also assumes different states during scan of the voltage at terminal 236 and during a hold condition, thereby preventing IF automatic fine tuning correction of the beat frequency discriminator 68 center frequency during scan of the voltage at terminal 236.

GENERAL OPERATION

In order to maintain consistency betwee the general description of the system shown in FIG. 1 and specific implementation of the various parts thereof shown in FIGS. 2–9, reference will be made in the following paragraphs to positive, negative and zero voltage conditions at various terminals of the system. It should be understood, however, that other combinations of voltage also may be employed to signify the existence of the various operating states of the apparatus.

In operation of the apparatus of FIG. 1, a channel is selected by inserting, for example, a tens digit and then a units digit into the selected channel memory 148 by means of the channel selector switches 142. If a channel between 2 and 9 is to be selected, a zero may be inserted as the tens digit. Upon completion of the selection of each digit, the digit is displayed on the channel display 156. Upon completion of selection of the units digit, the entire channel number selected appears at terminal 158 (for example, in a binary coded signal form) and a retune reset pulse occurs at terminal 150. The retune reset pulse resets the hold latch 170 to provide, for example, a zero voltage at terminal 174, resets the counter 118 to a "00" count, and resets the tuner bandswitching system 178 to an initial condition.

Resetting of tuner bandswitching system 178 results in, for example, zero voltage at each of terminals 190, 194 and 196 and a positive voltage at terminals 192 and 198. With such a voltage on terminal 198, the VHF tuner 14 is conditioned for reception of low band VHF (channels 2–6). At the same time, the voltage on terminal 192 causes the channel 5 and 6 calibration frequency translator 58 to be conditioned for a particular frequency shift of the signal at terminal 60 relative to the signal at terminal 56 when the units-equals-six decoder 132 or units-equals-five decoder 138 indicates the local oscillator has reached a corresponding frequency and a "hold" command (indicating one of these channels has been selected) is provided at terminal 180. The frequency shift provided for by the channel 5 and 6 calibration frequency translator 58, when tuning to channels 5 or 6, if necessary in receivers operating under channel allocations such as those employed in the United States in view of the fact that there is a 10 MHz frequency separation between channel 4 and 5 and a 16 MHz frequency separation between channel 4 and 6. These oscillator frequencies are not related to the harmonics of the 6 MHz harmonic generator as are the other VHF oscillator frequencies. It has been determined that a frequency shift of 52 MHz between the signals applied to terminal 56 and that derived from terminal 60 provides a particularly advantageous arrangement in the case of U.S. channel allocations, an explanation of which will appear below.

The retune reset pulse at terminal 184 of the tuner bandswitching system creates a bandswitch reset pulse (e.g., a negative voltage) at terminal 200 which is coupled to terminal 230 of the tuner frequency controller 101. This bandswitch reset pulse resets the voltage at terminal 236 to approximately zero to permit commencement of scanning and also resets the bandstart latch 97 to disable gate 93.

With a zero voltage at terminal 174 of the hold latch 170, the voltage on terminal 236 of the tuner frequency controller 101 begins to increase substantially linearly in a positive direction. This voltage is coupled to the VHF tuner 14 and causes the frequency of the oscillation of the VHF oscillator 18 to increase accordingly from an initial frequency of approximately 85 MHz. A sample of this VHF oscillator signal is routed through the bandstart detector 44 via terminals 52 and 54 to terminal 56 of the channel 5 and 6 calibration frequency translator 58. Since the counter 118 has been reset to a "00" count, the voltage at terminal 134 of the units-equals-six decoder 132 and terminals 140 of the units-equals-five decoder 138 are representative of a non-coincident count (e.g., at a positive voltage). Therefore, the frequency translation function of translator 58 is disabled and the signal frequency at terminal 60 of translator 58 is the same as the frequency at terminal 56. This signal is coupled to the mixer/beat frequency amplifier 32 and is there combined with the harmonics of the 6 MHz harmonic generator 26 for the purpose of creating beat frequency output signals at terminal 64 which are within the predetermined frequency range of the beat frequency discriminator 68.

As the "ramp" voltage on terminal 236 of the tuner frequency controller 101 increases and, in response thereto the oscillator frequency of the VHF oscillator 18 increases, the oscillator frequency reaches a frequency which corresponds to a first one of a plurality of preset frequencies to which the bandstart detector responds. This first frequency advantageously is selected equal to approximately 93 MHz, a frequency 8 MHz below 101 MHz, the U.S. industry standard oscillator frequency corresponding to VHF channel 2 in the United States. When this first frequency is encountered, a pulse occurs at terminal 45 of the bandstart detector 44. This pulse on terminal 45 sets the bandstart latch 97 so that the voltage at terminal 96 changes so as to enable gate 93, thus allowing signals at terminal 92 of gate 93 to pass to terminal 94.

As the oscillator frequency of VHF oscillator 18 increases further, the frequency difference between the VHF oscillator 18 and one of the harmonics of 6 MHz harmonic generator 26 comes within a predetermined range of the frequency to which beat frequency discriminator 68 is responsive. As the difference frequency decreases further, due to an increase in the VHF oscillator frequency, the voltage at terminal 74 starts increasing from its normal (e.g., zero voltage) value. This positive-going voltage is inverted by the invert gate 78 and is coupled to terminal 116 of counter 118 via gate 93, gate 103 and noise integrator 112. The negative-going pulse at terminal 116 advances the counter 118 to a "01" count.

As the frequency of the VHF oscillator 18 increases further, the positive voltage at terminal 74 of the beat frequency discriminator 68 continues to increase. The transition from zero voltage to a maximum positive voltage (e.g., 4 volts) on terminal 74 occurs over a predetermined range of frequencies. This predetermined range of frequencies may be altered by means of an automatic fine tuning signal obtained from the signal processing circuits 20 and coupled to terminals 70 and 72 of the beat frequency discriminator 68. The alteration of the predetermined frequency range provides for a uniform IF signal condition even in the presence of TV channel transmitter frequency deviations from the one allocated by the FCC.

As the frequency of the VHF oscillator 18 further increases, a zero beat (coincidence) occurs between one of the frequencies generated by the 6 MHz harmonic generator 26 and the VHF oscillator 18. Further increases of the frequency of the VHF oscillator 18 increase the difference frequency between the 6 MHz generator and the VHF oscillator frequency. As the predetermined frequency range of the beat frequency discriminator 68 is again traversed, the voltage at terminal 74 decreases from the maximum positive voltage to the zero voltage. A resultant negative-going pulse is inverted and coupled by invert gate 78, gate 93, gate 103 and noise integrator 112 to terminal 116 of counter 118. However, counter 118 is arranged to be only responsive to negative-going pulses and therefore the counter 118 is left at a "01" count.

As the VHF oscillator 18 continues to increase in frequency in response to an increase in the ramp voltage at terminal 236 of tuner frequency controller 101, additional counts are accumulated by counter 118 as harmonics of the 6 MHz harmonic generator 26 are encountered by the output of the VHF oscillator 18.

When the count accumulated by counter 118 is equal to the selected channel memory 148 output at terminal 158, a pulse (e.g., of positive polarity) is produced at terminal 166 of count comparator 162. This positive pulse at terminal 168 sets the hold latch 170 and provides, for example, a positive voltage at terminal 174 which stops the positive ramping of the voltage at terminal 236, inhibits the flow of pulses via the gate 103, and provides for automatic fine tuning compensation of the voltage at terminal 236 by means of the discriminator output voltage applied to terminal 104 of the tuner frequency controller 101.

OPERATION WHEN CHANNELS 5 OR 6 ARE SELECTED

If the channel selected by channel selector switches 142 is "05" or "06", when the count of the counter 118 equals the selected channel in the selected channel memory 148, a positive voltage will occur at terminal 174 of hold latch 170 and terminal 180 of calibration frequency translator 58. In addition, a zero voltage will exist at terminal 140 of units-equals-five decoder 138 or terminal 134 of units-equals-six decoder 132, depending upon the channel selected. The zero voltage on terminal 140 or 134 will result in a 52 MHz frequency translation of the frequency at terminal 60 of channel 5 and 6 calibration frequency translator 58 relative to the frequency of signal at terminal 56. In addition, a positive voltage will occur at terminal 226 of translator 58 which will cause a slight increase in the voltage at terminal 236 of the tuner frequency controller 101. This slight increase in voltage at terminal 236 is provided to increase the frequency of the VHF oscillator 18 since a "05" or "06" count occurs at 119 MHz or 125 MHz, respectively, which is 4 MHz less than the oscillator frequency required to receive channel 5 or 6, respectively.

OPERATION WHEN CHANNELS 7–13 ARE SELECTED

If the channel number selected by channel selector switches 142 is one of channels 7–13, when the counter 118 reaches a count of "06" terminal 134 of units-equals-six decoder 132 goes to zero volts. With zero volts on terminal 188 and terminal 176 of tuner bandswitching system 178, there will be zero volts on terminals 190, 194, and 198 and a positive voltage on terminals 192 and 196. In addition to the changes of voltages on terminals 190 through 198, a negative bandswitch reset pulse will occur at terminal 200 which will provide for a resetting of tuner frequency controller 101 to zero volts. With a positive voltage on the terminal 192, the channel 5 and 6 calibration frequency translator 58 is conditioned to translate the frequency of the signal at terminal 60 by 52 MHz with respect to the frequency of the VHF oscillator signal at terminal 56. Also, a positive voltage on terminal 192 enables invert gate 78. The positive voltage on terminal 196 conditions the VHF tuner for reception of channels 7-13 by, for example, switching bulk inductance in the tuned circuits of the tuner in the manner employed in the KRK-155 tuner previously identified.

Since the voltage at terminal 174 of hold latch 170 is zero due to a lack of satisfaction of the count comparator 162 (counter at "06" and selected channel memory at one of "07" through "13"), the voltage on terminal 236 of tuner frequency controller 101 begins to ramp positive. As the voltage at terminal 236 becomes more positive, the VHF oscillator 18 increases in frequency. When the VHF oscillator frequency has increased to a point corresponding to a second predetermined frequency of bandstart detector 44 (e.g., approximately 219 MHz, which is 2 MHz below the U.S. industry standard oscillator frequency corresponding to channel 7), a positive pulse again occurs at terminal 45 and sets bandstart latch 97, providing a plus voltage at terminal 96. As the VHF oscillator frequency increases further, positive pulses occur at terminal 74 of beat frequency discriminator 68 as harmonics of the 6 MHz harmonic generator are encountered by the output of VHF oscillator 18. These positive pulses are inverted and coupled via invert gate 78, gate 93, gate 103 and noise inverter 112 to terminal 116 of counter 118. These negative pulses on terminal 116 of counter 118 advance the counter from "06" until count comparator 162 is satisfied (equal input conditions at terminals 160 and 164), whereupon a positive voltage occurs at terminal 174 which stops the increase of voltage at terminal 236 of tuner frequency controller 101 and inhibits pulses from entering terminal 116 of counter 118 by disabling gate 103.

OPERATION WHEN CHANNELS 14-83 ARE SELECTED

When a channel in the UHF band is selected by the viewer, after having scanned through the low VHF channels and the high VHF channels in accordance with the aforementioned operation, upon reaching a "13" count in the counter 118, the terminal 128 of units-equals-three decoder 126 has a zero voltage thereon. Also, because of a lack of a match between the information in the selected channel memory 148 and counter 118, the terminal 174 of the hold latch 170 is at zero potential. With the bandswitching system in the high VHF band and having zero volts on terminals 176 and 186 of tuner bandswitching system 178, the voltage on terminals 190 and 194 becomes positive and the voltage on terminals 192, 196 and 198 becomes zero volts. With a positive voltage on terminal 190, the terminal 202 of the beat frequency discriminator 68 becomes positive and provides for an appropriate change of the predetermined frequency range of the beat frequency discriminator 68 in response to automatic fine tuning signals coupled between signal processing circuits 20 and terminals 70 and 72 of the beat frequency discriminator 68. Also, a positive voltage on terminal 190 is coupled to terminal 90 of non-invert gate 82. A positive voltage on terminal 90 enables the non-invert gate 82. A positive voltage on terminal 194 of tuner bandswtiching system 178 conditions UHF tuner 12 for reception of UHF signals.

It can be noted that in the operation of the tuning system for the reception of UHF signals, the non-invert gate 82 has been made operational, which can be contrasted to the utilization of the invert gate 78 in the operation of the tuning system for the reception of VHF signals. This alteration is made necessary by virtue of the fact that under the standards employed in the United States, the industry standard oscillator frequencies for reception of UHF channels are consistently 1 MHz above the harmonics of the 6 MHz harmonic generator, whereas industry standard oscillator frequencies for the reception of VHF channels, with the exception of channels 5 and 6, are consistently 1 MHz below the harmonics of the 6 MHz harmonic generator. In the operation of the tuning system for the reception of VHF channels, it can be noted in the aforementioned operation that positive-going transitions of voltage at terminal 74 occurred when the beat frequency produced by the mixer/beat frequency amplifier 32 was within the predetermined frequency range of the beat frequency discriminator 68 when the VHF oscillator signal was below the closest 6 MHz harmonic signal produced by the 6 MHz harmonic generator 26. This positive-going voltage was inverted by invert gate 78 which produced a negative-going voltage at the terminal 84. The negative-going voltage was of a proper polarity to advance the counter 118 and thereby provide for a match between the information in the selected channel memory 148 and the counter 118. A resultant positive hold voltage at terminal 174 of hold latch 170 is then produced at a frequency approximately 1 MHz below the zero beat frequency between the VHF oscillator signal and a harmonic of the 6 MHz harmonic generator.

Since it is desirable to create a hold condition at terminal 174 of hold latch 170 when the UHF oscillator signal frequency is 1 MHz above the zero beat frequency between the UHF oscillator signal and a harmonic of the 6 MHz harmonic signal generator, and since the voltage at terminal 74 of beat frequency discriminator 68 is going negative in the predetermined frequency range above the zero beat frequency, the voltage transition of terminal 74 of beat frequency discriminator 68 is coupled to counter 118 by means of non-invert gate 82.

Since the voltage at terminal 174 of hold latch 170 is zero due to a lack of satisfaction of the count comparator 162 (counter at "13" and selected channel memory at one of "14" through "83"), the voltage on terminal 236 of tuner frequency controller 101 begins to ramp positive. As the voltage at terminal 236 becomes more positive, the UHF oscillator 16 increases in frequency. When the UHF oscillator frequency has increased to a point corresponding to a third predetermined frequency of bandstart detector 44 (e.g., approximately 515 MHz, which is 2 MHz below the U.S. industry standard oscillator frequency corresponding to channel 14), a positive pulse again occurs at terminal 45 and sets bandstart latch 97, providing a plus voltage at terminal 96. As the VHF oscillator frequency increases further, positive pulses occur at terminal 74 of beat frequency discriminator 68 as harmonics of the 6 MHz harmonic generator are encountered by the output of the VHF oscillator 18. These positive pulses are coupled via non-invert gate 82, gate 93, gate 103 and noise inverter 112 to terminal 116 of counter 118. These negative pulses on terminal 116 of counter 118 advance the counter from "13" until count comparator 162 is satisfied (equal input conditions at terminals 160 and 164), whereupon a positive voltage occurs at terminal 174 which stops the increase of voltage at terminal 236 of tuner frequency controller 101 and inhibits pulses from entering terminal 116 of counter 118 by disabling gate 103. Also, automatic fine tuning compensation of the voltage at terminal 236 is provided for via terminal 104 of the tuner frequency controller 101.

Various parts of the apparatus shown in block diagram form in FIG. 1 may be implemented as shown in FIGS. 2–9. A brief description of each of these figures follows.

Figure 2:
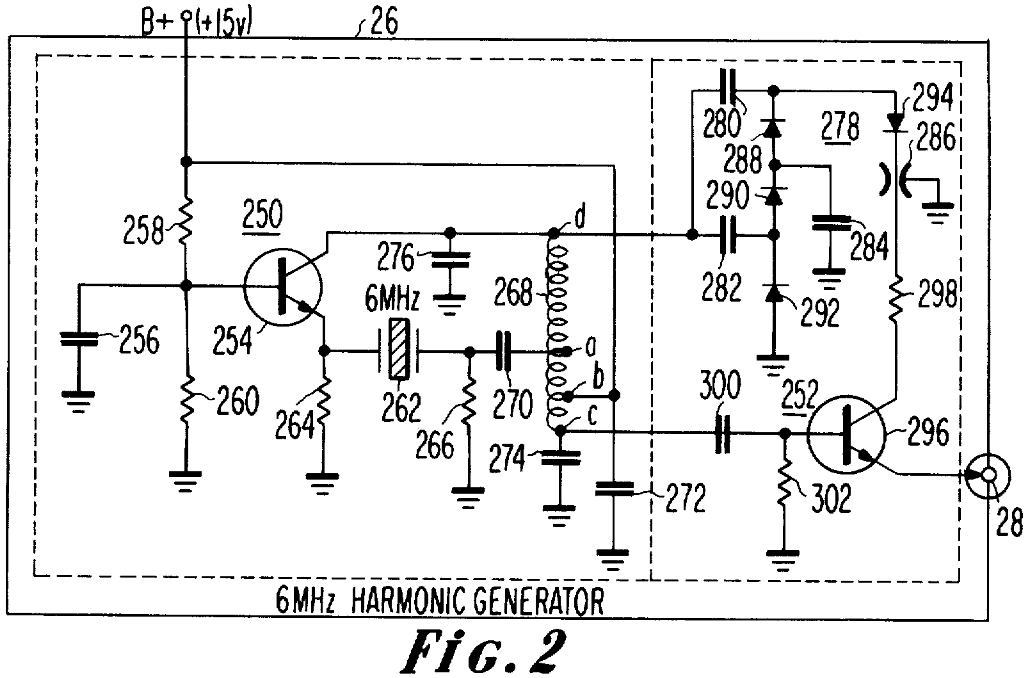
FIG. 2 illustrates in schematic form a 6 MHz harmonic generator suitable for use in the system shown in FIG. 1.

Referring to FIG. 2, the 6 MHz generator 26 is illustrated as comprising a base reference crystal controlled oscillator 250 and a harmonic generator portion 252. The crystal controlled oscillator 250 comprises an amplifier transistor 254, a frequency stabilizing crystal 262 and a feedback network comprising a transformer 268, a capacitor 270, a capacitor 274 and a capacitor 276. Capacitor 274 and capacitor 276 operate in conjunction with transformer 268 to form a parallel resonant circuit, resonant at or about the resonant frequency of the crystal 262.

The collector of transistor 250 is also coupled to a voltage multiplier 278 comprising capacitors 280, 282, 284 and 286 and diodes 288, 292 and 294. The collector electrode of an avalanche transistor 296 is coupled to the cathode of diode 294 by means of a resistor 298 and the cathode of diode 294 is coupled to reference potential by means of capacitor 286. The base electrode of avalanche transistor 296 is coupled to terminal *c* of transformer 268 by means of a capacitor 300 and is coupled to reference potential by means of a resistor 302. The emitter electrode of avalanche transistor 296 is coupled to terminal 28.

In operation, crystal controlled oscillator 250 generates a sinusoidal voltage at terminal *b* of transformer 268 which has a peak-to-peak voltage of, for example, approximately 25 volts with respect to reference potential and a proportionally lower peak-to-peak voltage with respect to reference potential at terminal *c* of transformer 268. The terminal *b* of transformer 268, which is coupled to reference potential by means of a capacitor 272, provides for a 180° phase difference between the voltages at terminal *d* and terminal *c* of transformer 268.

The voltage of terminal *d* of transformer 268 is multiplied by multiplier 278 to provide a voltage at the cathode of diode 294 which is, for example, approximately four times the peak value of the voltage at terminal *d* of transformer 268.

The sinusoidal voltage supplied by oscillator 250 is converted to a 0.5 nanosecond wide pulse which includes harmonics up to 1 gigahertz (frequency range) suitable for use in the system of FIG. 1. These harmonics are produced when transistor 296 is caused to operate in an avalanche breakdown mode. To provide for avalanche breakdown of the avalanche transistor 296, the collector-emitter capacity of transistor 296 is charged by means of the voltage at the cathode of the diode 294 when the voltage at terminal c of the transformer 268 is negative with respect to reference potential. As the voltage at terminal c of transformer 268 swings more positive (less negative), the base of avalanche transistor 296 approaches a voltage at which the baseemitter of avalanche transistor 296 will become forward biased. When the base-emitter junction of transistor 296 becomes forward biased, the charge on the collector-emitter capacity will be dissipated into the impedance coupled to the terminal 28. After the discharge of the collector-emitter capacity of the avalanche transistor 296, the collector voltage is approximately zero and the current flow through the resistor 298 is a maximum. The current through the resistor 298 discharges the capacitor 286 to approximately the charge on the capatitor 284 (approximately two times the peak voltage of the voltage at terminal d of transformer 268) since the voltage at the terminal b of transformer 268 is negative during this portion of the operation of transistor 296. As the voltage on terminal c of transformer 268 swings negative (less positive), the base-emitter junction of transistor 296 becomes reverse biased. At this point, the collector-emitter capacity of the transistor 296 begins to charge in response to a rising voltage at the cathode of diode 294. Since the voltage at the cathode of diode 294 is still increasing when the base-emitter junction of the transistor 296 becomes forward biased, which occurs on a steep slope of the sinusoidal voltage at the terminal c of transformer 268, a more consistent point of discharge of the collector-emitter capacity of transistor 296 is provided. With a more consistent point of discharge of the collector-emitter capacity of transistor 296, a more consistent harmonic output results at terminal 28. As noted above, this harmonic output includes components throughout the range of 101 to 931 MHz, the oscillator frequencies associated with channels 2–83 employed in the United States.

Figure 3:
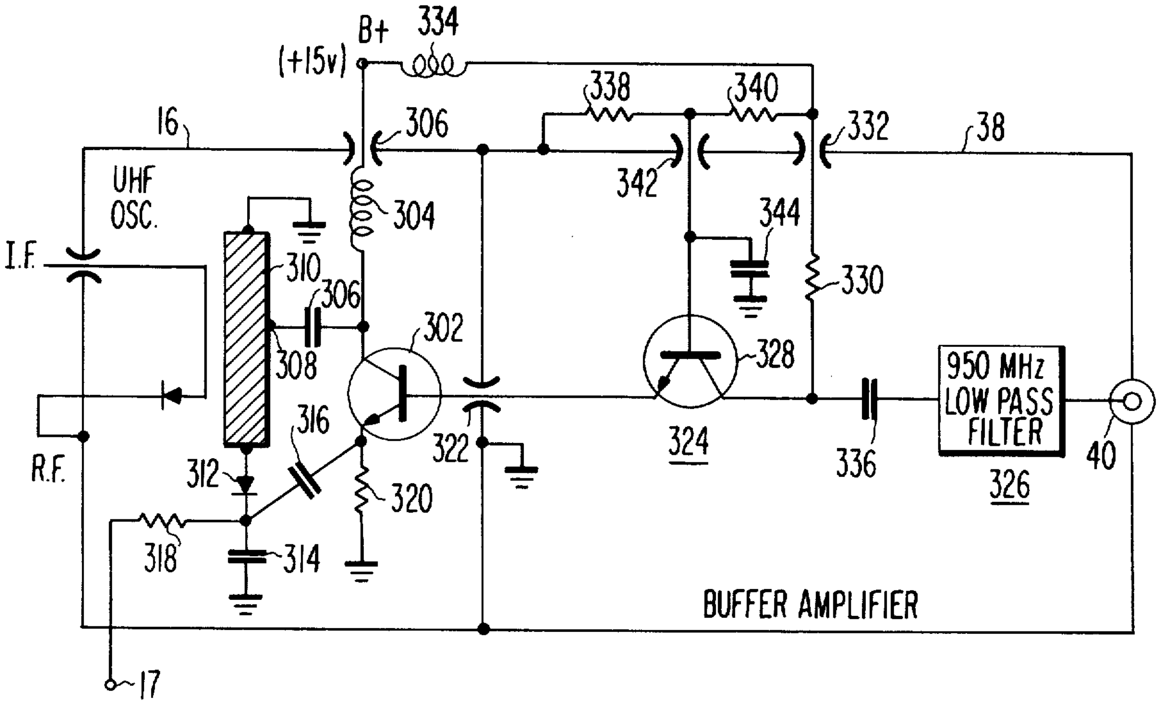
FIG. 3 illustrates in block and schematic form a buffer amplifier and associated UHF oscillator suitable for use in the system shown in FIG. 1.

Referring to FIG. 3, a buffer amplifier 38 is shown which is suitable for coupling to the UHF oscillator 16 and for providing a sample of the UHF oscillator signal without introducing interference into the IF signal output of the UHF tuner 12. In FIG. 3, a transistor 302 operated as a UHF grounded base oscillator is shown having a collector electrode coupled to a tap terminal 308 on a transmission line inductor 310. The oscillator also includes a varactor diode 312, a capacitor 314, a capacitor 316 and appropriate biasing and supply connection as is shown. The junction of capacitors 314 and 316 is coupled to control terminal 17 via a resistor 318. The buffer amplifier 38 comprises a grounded base transistor amplifier 324 and a 950 MHz low pass filter 326. A transistor 328 of grounded base amplifier 324 has an emitter electrode coupled to the base electrode of oscillator transistor 302 via a capacitor 322. Bias and operating voltage are supplied to transistor 324 via resistors 330, 340, 338 and RF choke 334. The collector of transistor 328 is also coupled to an input terminal of the 950 MHz low pass filter 326 by means of a capacitor 336. An output terminal of the 950 MHz low pass filter 326 is coupled to terminal 40.

In operation, UHF oscillator 16 produces in the transmission line inductor 310 a signal which, when mixed with the received RF frequencies, will produce standard IF frequencies. The frequency of oscillation of the UHF oscillator 16 is determined by the level of positive voltage applied to terminal 17. This voltage varies the capacity of the varactor diode 312 and thereby changes the resonant frequency of the series combination of transmission line inductor 310, varactor diode 312 and capacitor 314. The transistor 312 operating in a grounded base mode has a feedback signal coupled to the emitter electrode by means of capacitor 316 and couples an amplified reinforcing signal to the resonant circuit by means of capacitor 306.

The UHF oscillator 16 is of a conventional design with the exception of the value of the feedthrough capacitor 322. To provide for adequate bypass of the signals at the base of transistor 302, the capacity value of capacitor 322 would normally be approximately 1,000 picofarads. In this circuit, the capacitor 322 is approximately 82 picofarads. This reduced capacity value provides for a larger peak-to-peak voltage swing of the base electrode voltage during oscillation of UHF oscillator 16. This peak-to-peak voltage swing at the base of transistor 302 is coupled to the emitter electrode of transistor 328. The transistor 328 being connected in a common-base amplifier mode provides for an increased peak-to-peak voltage swing at the collector electrode with respect to the emitter electrode. In addition, signals coupled via terminal 40 from bandstart detector 44, mixer/beat frequency amplifier 32, or other system components, into the collector electrode of transistor 328 will be greatly attenuated by the grounded base transistor stage and, thus, will reduce the amount of interfering signal presented to the base of the oscillator transistor 302. The 950 MHz low pass filter prevents tuner oscillator harmonics above 950 MHz from reaching the mixer/beat frequency amplifier.

Figure 4:
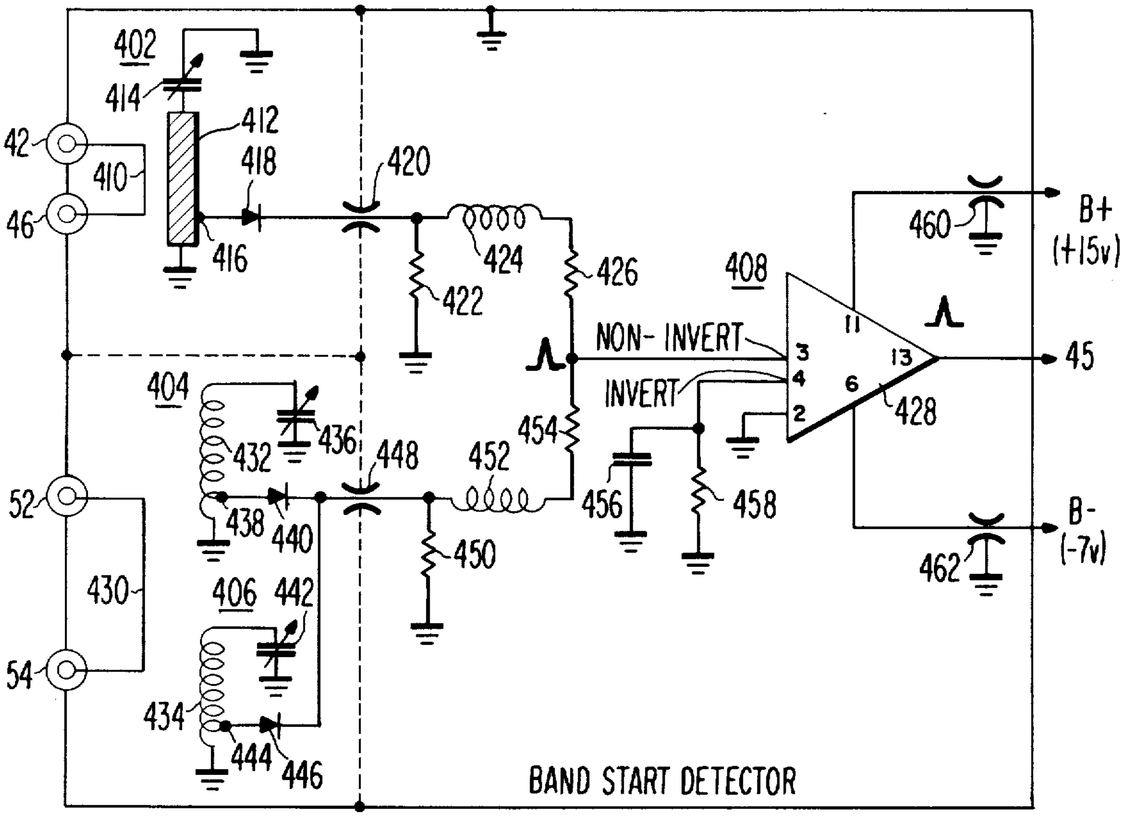
FIG. 4 illustrates in schematic form a bandstart detector suitable for use in the system shown in FIG. 1.

Referring to FIG. 4, the bandstart detector 44 comprises a UHF bandstart resonant circuit and peak detector 402, a low band VHF bandstart resonant circuit and peak detector 404, a high band VHF bandstart resonant circuit and peak detector 406, and a pulse amplifier 408.

In the UHF resonant circuit, an input inductor 410 is coupled between terminals 42 and 46 and is inductively coupled to a transmission line inductor 412. Transmission line inductor 412 has a first end coupled directly to reference potential and another end coupled to reference potential by means of a variable capacitor 414. Capacitor 414 is adjusted, for example, so that a resonant condition is produced at a frequency of 515 MHz, a frequency which is 2 MHz below the industry standard oscillator frequency of channel 14 in the United States.

A tap 416 on transmission line inductor 412 is coupled to the anode of a detector diode 418. The cathode of the diode 418 is coupled via a feedthrough capacitor 420, a resistor 422, an RF choke 424 and a resistor 426 to the pin 3 of an operational amplifier 428.

In the VHF resonant circuits, an input inductor 430 is coupled between terminals 52 and 54 and is inductively coupled to an inductor 432 and an inductor 434. A first terminal of inductor 432 is coupled to reference potential while another terminal thereof is coupled to reference potential by a variable capacitor 436. A tap 438 on an inductor 432 is coupled to the anode of a peak detector diode 440. A similar arrangement of inductor 434 and a variable capacitor 442 is provided. Capacitors 436 and 444 are adjusted to produce resonant conditions at a frequency of 94 and 219 MHz, which are frequencies 8 and 2 MHz below the standard oscillator frequencies of channels 2 and 7, respectively, in the United States. The reason it is necessary to tune the tuned circuit comprising capacitors 436 and inductor 432 to a frequency 8 MHz below channel 2 is to provide a "01" count at 6 MHz below channel 2 and an appropriate "02" count at channel 2. A tap 444 on inductor 434 is coupled to the anode of peak detector diode 446. The cathode of peak detector diode 440 and the cathode of peak detector diode 446 are coupled via a feedthrough capacitor 448, a resistor 450, an RF choke 452, and a resistor 454 to pin 3 of the operational amplifier 428. The pin 4 of operational amplifier 428 is coupled to reference potential by means of a parallel combination of a capacitor 456 and a resistor 458. B+ is coupled to pin 11 of operational amplifier 428 and is bypassed to reference potential by means of a feedthrough capacitor 460. B− is coupled to pin 6 of operational amplifier 428 and is bypassed to reference potential by means of a feedthrough capacitor 462. Pin 13 of operational amplifier 428 is coupled to terminal 45 and pin 2 is coupled to reference potential.

In operation, a sample of the UHF oscillator signal is coupled to terminal 42 and fed to terminal 46 via input inductor 410. The signal is also coupled to the transmission line inductor 412. As the frequency of the UHF oscillator approaches the resonant frequency of the series combination of transmission line inductor 412 and variable capacitor 414, the voltage at the tap terminal 416 of transmission line inductor 412 starts to increase with respect to reference potential. The voltage developed at terminal 416 is rectified by means of peak detector diode 418 and provides for a charge accumulation on feedthrough capacitor 420. When the UHF oscillator signal frequency is equal to the frequency of resonance of the combination of transmission line inductor 412 and variable capacitor 414, the voltage on the isolated terminal of feedthrough capacitor 420 is a miximum. As the frequency of the UHF oscillator signal increases, the voltage at terminal 416 of transmission line inductor 412 decreases and the resistor 422 provides for a discharging of feedthrough capacitor 420 in response to the decrease in voltage at terminal 416. The series combination of the inductor 422 and the resistor 426 provides for an additional attenuation of the AC component of the voltage at pin 3 of the operational amplifier 428.

A sample of the VHF oscillator signal coupled to terminal 52 is fed to terminal 54 via the input inductor 430. The signal is also coupled to the inductor 432 and the inductor 434. As the frequency of the VHF oscillator signal increases and approaches the resonant frequency of the series combination of inductor 432 and variable capacitor 436, the voltage at the tap terminal 438 is rectified by means of the peak detector diode 440 and provides for a charge accumulation on the feedthrough capacitor 448. The voltage at tap terminal 438 reaches a maximum at the resonant frequency of the series combination of inductor 432 and the variable capacitor 436 (93 MHz). As the frequency of the VHF oscillator signal increases further, the voltage at the tap terminal 438 starts to decrease and the voltage on the feedthrough capacitor 448 is discharged by means of resistor 450. As the VHF oscillator signal frequency increases even further, the frequency of the series combination of inductor 434 and variable capacitor 442 is reached (219 MHz). A charge is accumulated on feedthrough capacitor 448 by means of the rectification of the voltage at terminal 442 by means of the peak detector diode 446. The series combination of RF choke 452 and resistor 454 further decreases the VHF oscillator signal frequency content reaching pin 3 of the operational amplifier 428.

As the voltage builds on feedthrough capacitor 420 or feedthrough capacitor 448, a point is reached where due to the exceedingly high gain of the operational amplifier 428, the voltage at terminal 45 increases toward B+ potential. A resulting positive pulse is coupled from terminal 45 to bandstart latch 97 (FIG. 1) as was explained above.

Figure 5:
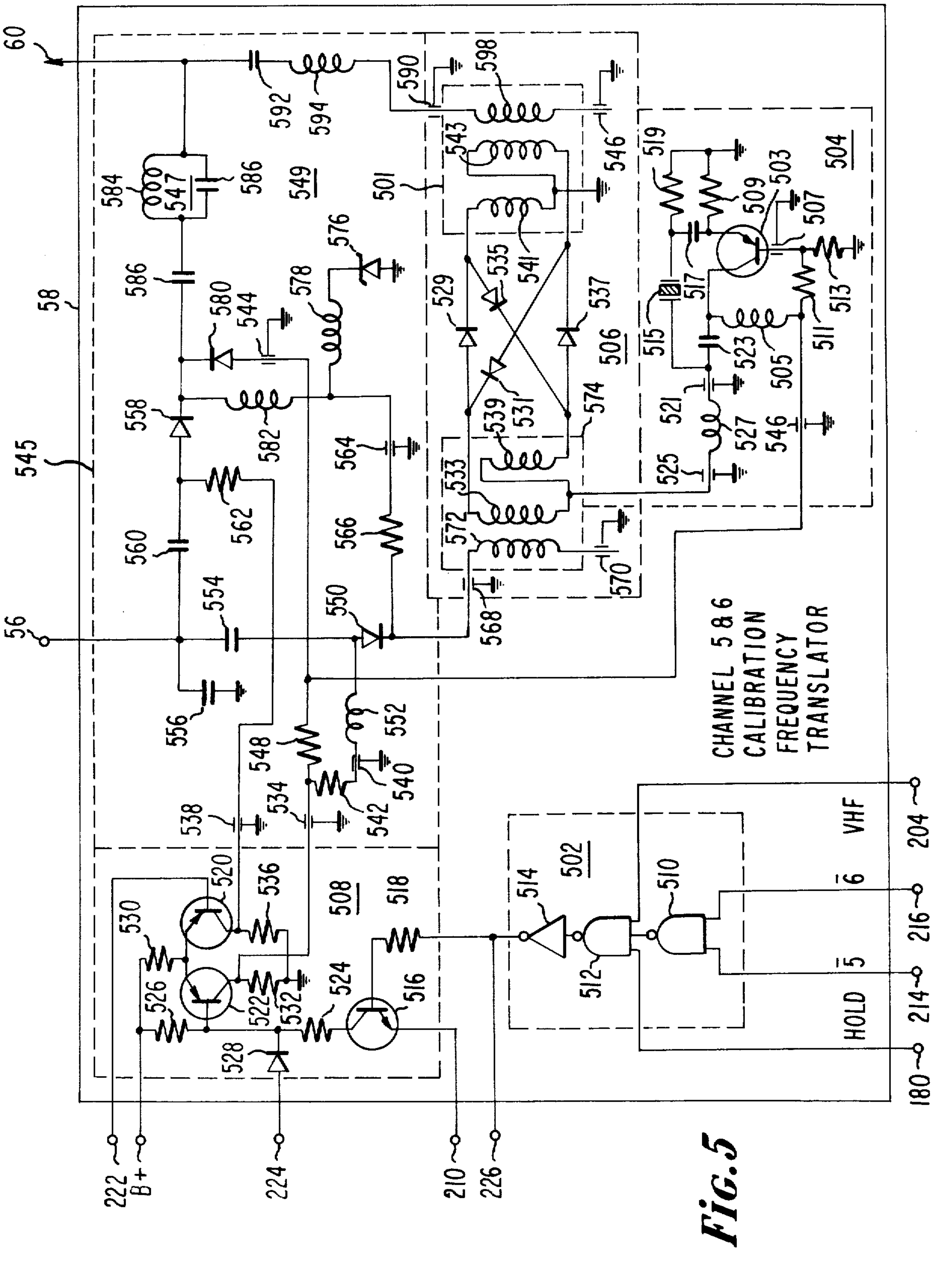
FIG. 5 shows in schematic form a channel 5 and 6 frequency translator suitable for use in the system shown in FIG. 1.

Referring to FIG. 5, channel 5 and 6 calibration frequency translator 58 comprises an AND circuit 502, a 52 MHz crystal controlled oscillator circuit 504, a balanced mixer circuit 506, a power switching circuit 508, and a signal switching circuit 545.

The AND circuit 502 comprises a dual input NAND gate 510 having one gate coupled to terminal 216 and the other gate coupled to terminal 214. The output of the dual input NAND gate 510 is coupled to one input of a triple input NAND gate 512. The second input of the triple input NAND gate 512 is coupled to terminal 180 and the third input of triple input NAND gate 512 is coupled to terminal 204. The output of triple input NAND gate 512 is coupled to the input of an inverting amplifier 514. The output of inverting amplifier 514 is coupled to the terminal 226.

In power switching circuit 508, a switching driver transistor 516 is coupled to terminals 226 and 210 and is further coupled to a first switching transistor 522. A second switching transistor 520 is coupled to transistor 522 to provide for complementary output voltages at the collectors of transistors 520 and 522. The second switching transistor 520 provides for B+ switching to allow coupling of the VHF oscillator signal on terminal 56 to the terminal 60. The first switching transistor 522 provides for mixing of the VHF oscillator signal at terminal 56 with a 52 MHz output signal derived from the 52 MHz oscillator 504 to obtain at terminal 60 a translated signal having a frequency that is 52 MHz less than the VHF oscillator signal on terminal 56.

The collectors of transistors 520 and 522 are coupled to the signal switching circuit 545 comprising signal switching diodes 550, 558 and 580; biasing resistors 542, 548, 562 and 566; radio frequency chokes 552, 582 and 578; bypass capacitors 534, 538, 540, 544 and 564; coupling capacitors 554, 560 and 588; bandpass filter 547 comprising an inductor 584 and a capacitor 586 and bandpass filter 549 comprising an inductor 594 and a capacitor 592; a zener diode 576 and a low pass filter capacitor 556. The signal switching circuit is coupled to terminals 56 and 60 and to the balanced mixer circuit 506 comprising an input transformer 574; an output transformer 501; diodes 529, 531, 535 and 537; and transformer resonating capacitors 568, 570, 590 and 596. The 52 MHz crystal controlled oscillator is coupled to the balanced mixer circuit and to the signal switching circuit 545.

In operation, the voltages at terminals 180, 204, 214 and 216 determine when the frequency of the signal at terminal 60 is the same as the frequency of the signal at terminal 56 and when the frequency of the signal at terminal 60 is translated to a frequency which is 52 MHz less than the frequency of the signal at terminal 56.

FREQUENCY TRANSLATION

With a hold signal on terminal 180, a signal on terminal 204 indicating the tuner bandswitching system 178 is in VHF and a signal on terminals 214 and 216 indicating the counter 118 contains an "05" or "06" count (all "positive" inputs to gate 512), the output of triple input NAND gate 512 is zero, and the output of inverting amplifier 514 is positive. The base-emitter junction of switching transistor 516 will be forward biased, thereby producing saturation of first switching transistor 522 and cutoff of the second switching transistor 520. The voltage at the collector of power switching transistor 520 is equal to approximately zero volts. The collector voltage of power switching transistor 522, however, is equal to approximately B+.

With approximately B+ on the collector of transistor 522, current will flow through resistor 542, inductor 552, diode 550, resistor 566, inductor 578 and zener diode 576. Also, current will flow through resistor 548, diode 580, inductor 582, inductor 578 and zener diode 576. Additionally, current will flow through resistor 548 to supply current into the 52 MHz oscillator 504.

The current that flows through diode 550 will reduce the impedance of this diode to provide for oscillator signal flow from the VHF oscillator 18 (FIG. 1) into the input transformer 574 via feedthrough capacitor 568. At the same time, diode 558, which is reverse biased, provides for a high impedance path for signals from terminal 56. Additional attenuation of the signal at the cathode of diode 558 is provided for by means of the forward bias diode 580 which exhibits a very low impedance and whose anode is bypassed to reference potential by means of the feedthrough capacitor 544. The attenuation of signal at the cathode of diode 558 minimizes the direct coupling of signals on terminal 56 to terminal 60.

With a voltage of approximately 15 volts on the cathode of diode 580, there is a voltage of approximately 15.7 volts on the anode of diode 580. With approximately 15.7 volts on the anode of diode 580, the oscillator circuit 504 is activated and produces a 52 MHz sinusoidal signal which is coupled to the input transformer 574 of balanced mixer circuit 506.

With the input signal from terminal 56 applied to the input transformer 574 and the 52 MHz oscillator signal applied to the transformer 574, a mixing action occurs by means of the diodes 529, 531, 535 and 537 to produce in the output transformer 501 a signal equal to the frequency of the signal at terminal 56 minus 52 MHz. The translated signal is coupled to terminal 60 by means of the series combination of capacitor 592 and inductor 594 which provides for an attenuation of the components of signal other than the difference between the signal frequency at terminal 56 and the oscillator signal derived from 52 MHz oscillator 504. Additionally, the parallel combination of inductor 584 and capacitor 586, in combination with capacitor 588, forward bias diode 580 and the feedthrough capacitor 544 to provide for shunt attenuation of signals at terminal 60 other than the difference frequency between the signal at terminal 56 and the signal produced by the 52 MHz oscillator 504.

NON-TRANSLATION

In the absence of a hold signal on terminal 180, a signal on terminal 204 indicating the tuner bandswitching system 178 is in VHF or a signal on terminal 214 or 216 indicating the counter contains a "05" or "06" count, the output of triple input NAND gate 512 is positive and the output of inverting amplifier 514 is zero volts. The voltage at terminal 226 then is zero, the switching transistor 516 is cut off, the first switching transistor 522 is cut off, and the second switching transistor 520 is saturated. The voltage at the collector of transistor 520 therefore is equal to approximately B+. Under these conditions, current flows through resistor 562, diode 558, inductor 582, inductor 578 and zener diode 576. The current flow through diode 558 provides for a low impedance path for current flow between terminal 56 and terminal 60 via capacitor 560, diode 558, capacitor 588, and the parallel combination of inductor 584 and capacitor 586. Because of the zener diode 576, the cathode voltage at the diode 558 is approximately 15 volts. With zero volts on the collector of power switching transistor 522, the voltage on the anode of diode 550 and the anode of diode 580 is also approximately zero. Since the cathodes of diodes 550 and 580 are coupled to the zener diode 576 and thereby are at approximately 15 volts, both diodes are reverse biased and present a very high impedance to signals on the terminal 56 and decouple the balanced mixer circuit 506 and the 52 MHz crystal controlled oscillator from the signal at terminals 56 and 60.

The translation frequency of the oscillator 504 was selected to be a frequency outside the RF pass band of the VHF tuner of the television receiver to provide a difference frequency between the oscillator and the signal at terminal 56 which was 1 MHz below a harmonic of the 6 MHz harmonic generator and a frequency which is 10.75 MHz less than the audio IF frequency of the television receiver. The first selection criteria relates to maintaining acceptable performance of the television receiver without making too critical the task of shielding the 52 MHz signal from the antenna terminals of the television receiver. The second selection criteria relates to providing consistent performance of the tuning system throughout the VHF band. That is to say, all VHF oscillator frequencies coupled to the mixer/beat frequency amplifier are arranged to be 1 MHz less than a harmonic of the 6 MHz harmonic generator 26 when proper tuning is obtained. The third selection criteria would provide for a dual use of the 52 MHz oscillator, one in the tuning system and the other in providing for the use of a standard 10.7 MHz IF FM integrated circuit for both television and FM radio receivers. This dual use of the 52 MHz oscillator would provide for a defraying of the cost of the 52 MHz oscillator circuitry.

Figure 6:
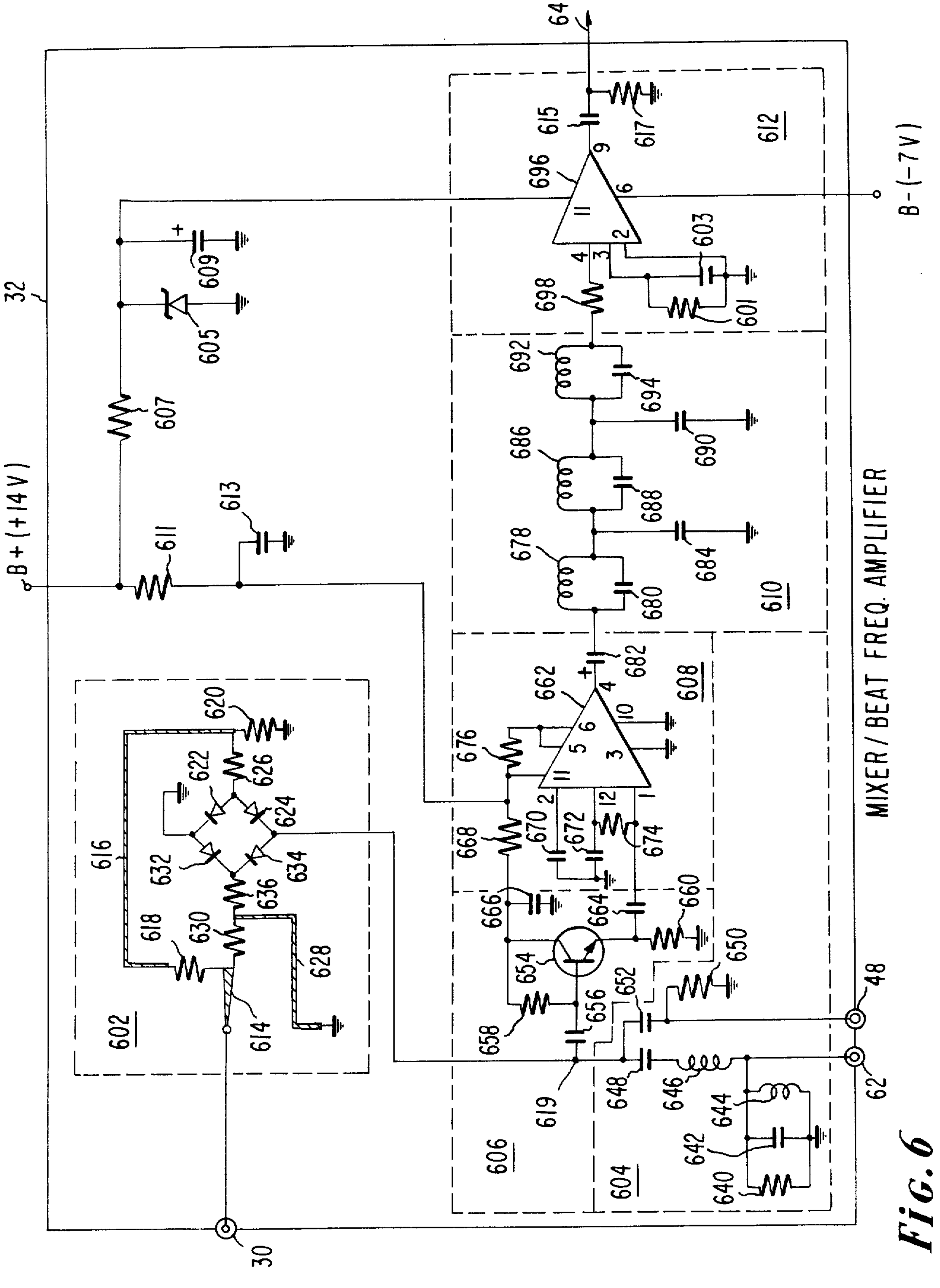
FIG. 6 illustrates in schematic form a mixer/beat frequency amplifier suitable for use in the system shown in FIG. 1.

Referring to FIG. 6, the mixer/beat frequency amplifier 32 comprises a mixer circuit 602, a VHF/UHF combiner filter 604, an impedance matching buffer amplifier 606, a 90 db limiting amplifier 608, a zero to 3 MHz low pass filter 610, and a 60 db limiting amplifier 612.

The terminal 30 is coupled to a first terminal of an impedance transforming transmission line 614 of mixer circuit 602. A second terminal of the impedance transforming transmission line 614 is coupled to a transmission line 616 which delays signal and a transmission line 628 which delays and inverts signal at the second terminal of the impedance transforming transmission line 614. The output terminals of these transmission lines 616 and 628 are coupled to a diode bridge comprising diodes 622, 624, 632 and 634 which is also coupled to an input terminal 619 of the impedance matching buffer amplifier 606.

Terminal 62 is coupled to reference potential by means of a first VHF bandpass filter comprising a resistor 640, a capacitor 642 and an inductor 644, and coupled to the input terminal 619 by means of a second VHF bandpass filter comprising an inductor 646 and a capacitor 648. The terminal 48 is coupled to reference potential by means of a resistor 650 and coupled to the input terminal 619 by means of a capacitor 652.

The impedance matching buffer amplifier 606 which comprises a transistor 654 having a base electrode coupled to terminal 619 provides for power gain with minimum loading of signals at terminal 619. The emitter of transistor 654 is coupled to the pin 1 of an integrated circuit 662 of 90 db limiting amplifier 608 which develops a signal of uniform amplitude at pin 4. Pin 4 of integrated circuit 662 is coupled to low pass filter 610 to limit the maximum frequency to be coupled to pin 4 of integrated circuit 696 of 60 db limiting amplifier 612 to 3 MHz. Pin 9 of integrated circuit 696 provides a signal of uniform amplitude and a maximum frequency of 3 MHz which is coupled to pin 64.

In operation, a pulse several volts in amplitude and approximately one-half nanosecond in width is supplied to the terminal 30 of the mixer/beat frequency amplifier. This pulse propagates down transmission line 628 to reference potential, then propagates back to a first terminal of the diode bridge. Simultaneously, the positive pulse at the second terminal of the impedance transforming tapered transmission line 614 is propagated through the transmission line 616. This positive pulse arrives at a second terminal of the bridge coincidentally with the arrival of the negative pulse at the junction of resistors 630 and 636. The combination of the positive and negative pulses serves to forward bias the diode bridge including diodes 622, 626, 632 and 634 causing a sub-nanosecond short circuit to exist between reference potential and the terminal 619 of the impedance matching buffer amplifier 606.

During VHF operation, signals representative of the local oscillator output of VHF tuner 14 are present on terminal 62 and are coupled via the bandpass filter circuits comprising resistor 640, capacitor 642, inductor 644, inductor 646 and capacitor 648 to terminal 619. During UHF operation, signals representative of the local oscillator output of UHF tuner 12 are present on terminal 48 and are coupled via a capacitor 652 to terminal 619. The resulting mixed signals at terminal 619 are therefore a mixture of signals at terminal 30, terminal 48 and terminal 62. These signals are coupled to the base of buffer amplifier 654. Signals present on the emitter of buffer amplifier 654 are coupled to terminal 1 of integrated circuit 662. The amplified signal at the output terminal 4 of integrated circuit 662 is coupled to the input terminal 4 of integrated circuit 696 by means of a 0 to 3 MHz low pass filter 610. The amplified signal at terminal 9 of integrated circuit 696 is then coupled to terminal 64.

Figure 7:
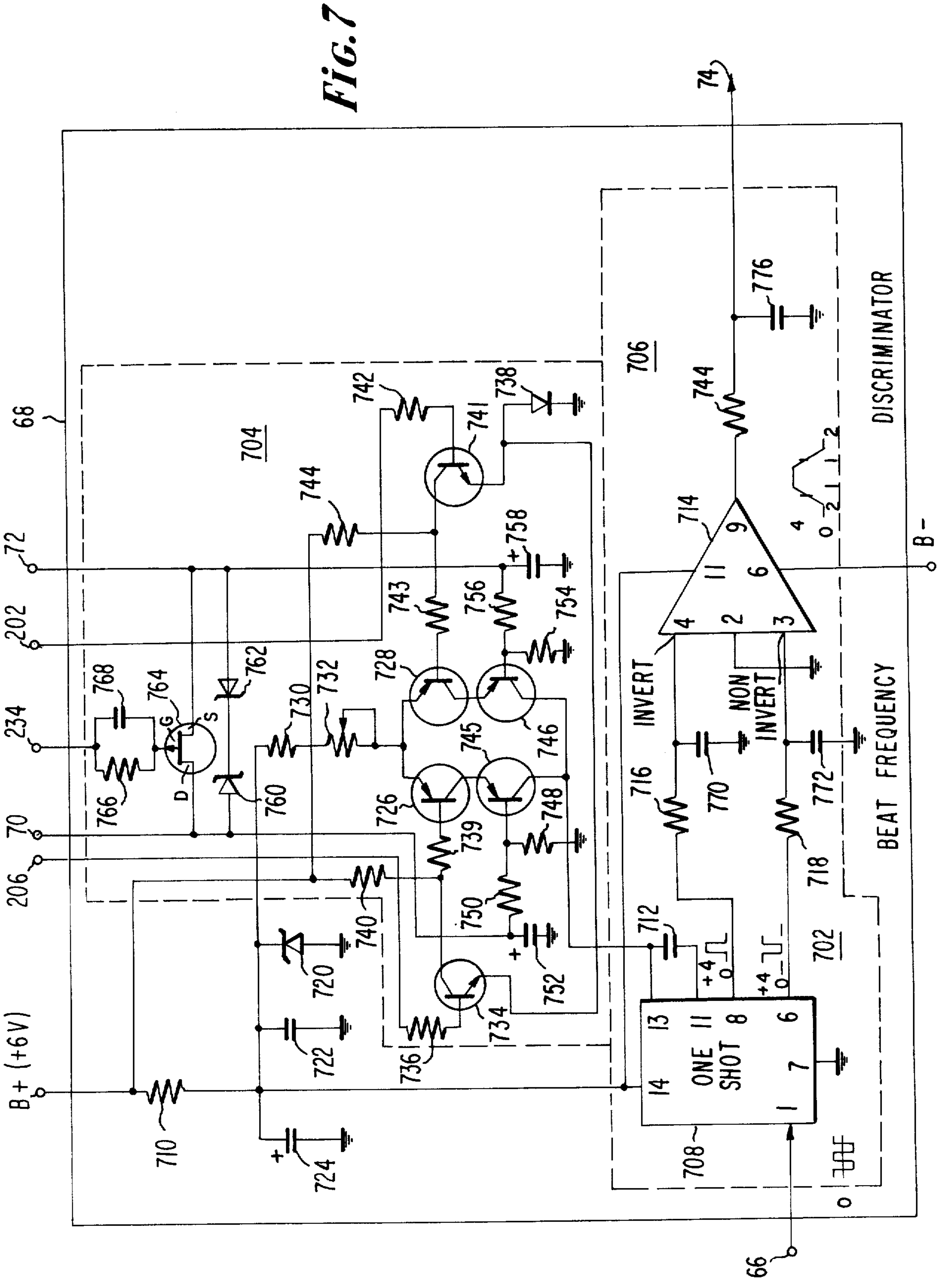
FIG. 7 shows in schematic form a beat frequency discriminator suitable for use in the system shown in FIG.1.

Referring to FIG. 7, the beat frequency discriminator 68 comprises a one-shot circuit 702, a fine tuning circuit 704, and a voltage comparator amplifier circuit 706.

A retriggerable one-shot integrated circuit 708 has an output pin 8 and an output pin 6 which produce complementary pulses in response to a pulse applied to terminal 66 and coupled to pin 1. The duration of the pulses at pin 8 and pin 6 is determined by the current flow between a pin 13 and a pin 14 and the value of a capacitor 712 coupled between pin 11 and pin 13. The output pin 8 is coupled to a signal input pin 4 of a voltage comparator integrated circuit 714 by means of an integrator comprising a resistor 716 and a capacitor 770 and the output pin 6 is coupled to a signal input pin 3 of the integrated circuit 714 by means of an integrator comprising a resistor 718 and a capacitor 772. The output pin 9 of integrated circuit 714 is coupled to terminal 74 and provides a voltage at terminal 74 which is proportional to the relationship between voltage levels at pins 3 and 4.

The fine tuning circuit 704 is coupled between pins 13 and 14 of integrated circuit 708 and provides for changing the duration of the pulse at terminals 6 and 8 in accordance with information on terminals 70, 72, 202 and 206. Transistors 734 and 726 which are coupled to terminal 206 provide for coupling a transistor 745 between pins 13 and 14 of integrated circuit 708 so that the voltage at terminal 70 can control the current between pins 13 and 14 during VHF signal reception. Transistors 728 and 741 which are coupled to terminal 202 provide for coupling a transistor 746 between pins 13 and 14 of integrated circuit 708 so that the voltage at terminal 72 can control the current between pins 13 and 14 during UHF signal reception. The current flow between pins 13 and 14 with a given voltage on terminal 70 or 72 is determined by the resistance value of resistors 730 and 732.

A field effect transistor 764 coupled between terminals 70 and 72 provides for the nominalizing of the voltages at terminals 70 and 72 in response to a voltage at terminal 234 which is coupled to transistor 764.

In operation, the symmetrically clipped beat frequency sinusoidal wave produced by the mixer/beat frequency amplifier 32 is coupled via terminal 66 to pin 1 of the retriggerable one-shot integrated circuit 708. When the voltage on pin 1 goes negative, a positive pulse occurs on pin 8 and a negative pulse occurs on pin 6. When the period of the signal at pin 1 of the one-shot integrated circuit 708 is equal to two times the pulse duration at pin 8 and pin 6, the integrated voltages at pin 3 and pin 4 of the voltage comparator integrated circuit 714 are equal. Therefore, the voltage at terminal 74 is equal to approximately 2 volts. As the period of the signal on pin 1 of one-shot integrated circuit 708 increases, the integrated voltage on pin 4 of integrated circuit 714 decreases and the integrated voltage on pin 3 of the integrated circuit 714 increases, which results in an increase in voltage at terminal 74. When the period of the signal at pin 1 of the one-shot integrated circuit 708 decreases, integrated voltage on pin 4 of the integrated circuit 714 increases and the integrated voltage on pin 3 of the integrated circuit 714 decreases, which results in a decrease in voltage on terminal 74. The maximum range of voltage at terminal 74 occurs in a predetermined range of frequencies which is determined by the current flow between pin 13 and the pin 14 of one-shot integrated circuit 708.

SCAN MODE

When the voltage on terminal 236 of tuner frequency controller 101 (FIG. 1) is being swept in a manner required to accumulate on the counter 118 a count which is equal to information in selected channel memory 148, the terminal 234 is at ground potential. With terminal 234 at ground potential, field effect transistor 764 has a low channel resistance (resistance between drain and source); therefore, the voltage at terminal 70 is equal to the voltage at terminal 72. While scanning through the VHF channels (2–13) the voltage on terminal 206 is positive, causing the transistor 734 to go into saturation. With the transistor 734 in saturation, the transistor 726 is switched on and current flows from pin 14 of one-shot integrated circuit 708 through resistor 730, variable resistor 732, transistor 726, transistor 745 and to pin 13 of one-shot integrated circuit 708. Since the voltage on the base of transistor 745 is constant with respect to pin 14 of the one-shot integrated circuit 708, current flow into pin 13 of one-shot integrated circuit 708 is a function of the total resistance of resistors 730 and 732.

When scanning through the UHF channels (14–83), the terminal 202 is positive and transistor 741 is saturated, causing the transistor 728 to be switched on. With the transistor 728 switched on, currrent flows from pin 14 of the one-shot integrated circuit 708 through resistor 730, variable resistor 732, transistor 728, and transistor 746 to pin 13 of one-shot integrated circuit 708. In this mode, the voltage on the base of transistor 746 is a constant and the current flow into pin 13 of one-shot integrated circuit 708 is a constant.

CHANNEL HOLD MODE

When the count of the counter 118 equals the information in the selected channel memory 148, the tuner frequency controller 101 stops scanning. When in a hold mode, the voltage on terminal 234 goes positive and the field effect transistor 764 is turned off. If a hold occurs in the VHF band, the transistors 734 and 736 are switched on; therefore, the transistor 745 controls the current into pin 13 of one-shot integrated circuit 708. If a hold occurs in the UHF band, transistor 741 and transistor 728 are switched on; therefore, the current flow into pin 13 of one-shot integrated circuit 708 is controlled by transistor 746.

When the oscillator frequency of VHF tuner 14 or the UHF tuner 12 must be increased to maintain proper intermediate frequency conditions, the voltage at terminal 70 becomes more positive and the voltage at terminal 72 becomes less positive. However, if the oscillator frequency of the VHF tuner 14 or the UHF tuner 12 must decrease to maintain a constant IF signal condition, the voltage at terminal 70 becomes less positive and the voltage at terminal 72 becomes more positive.

Assuming a requirement for an increase in oscillator frequency of the VHF tuner, the voltage on the terminal 70 will become more positive, reducing the current flow through transistor 745 and decreasing the current flow into pin 13 of one-shot integrated circuit 708. With a reduced current flow into pin 13, the pulse width at terminal 6 and terminal 8 will be increased, which will increase the voltage at pin 4 of comparator integrated circuit 714, which will result in a reduction of the voltage at terminal 74. A reduction in the voltage at terminal 74 will provide an increase in the voltage at terminal 104 of tuner frequency controller 101 because of the inversion of polarity provided by the invert gate 78 (FIG. 1). A positive voltage on terminal 104 of tuner frequency controller 101 provides for an increase in frequency of the VHF oscillator 18 and a decrease in the beat frequency occurring at pin 1 of one-shot integrated circuit 708 since the VHF oscillator frequency is less than the nearest harmonic of the 6 MHz harmonic generator 26. An opposite result occurs if the voltage on terminal 70 becomes less positive.

Assuming a requirement of an increase of oscillator frequency of the UHF tuner 12, the voltage on terminal 70 becomes more positive and the voltage on terminal 72 becomes less positive. With the voltage on terminal 72 becoming less positive, the current flow through transistor 746 increases; therefore, the current flow into pin 13 of one-shot integrated circuit 708 also increases. An increase in the current flow into pin 13 of one-shot integrated circuit 708 decreases the pulse width at pin 6 and pin 8 of one-shot integrated circuit 708. A decrease in pulse width at pin 8 and pin 6 decreases the voltage at pin 4 and increases the voltage at pin 3 of comparator integrated circuit 714. A corresponding increase in the voltage at terminal 74 occurs as a result of the change in voltage at pin 3 and pin 4 of comparator integrated circuit 714. An increase in the voltage at terminal 74 of beat frequency discriminator 68 provides an increase in voltage at terminal 104 of tuner frequency controller 101 due to the coupling through the non-invert gate 82. Since the UHF oscillator frequency is above the nearest harmonic of the 6 MHz harmonic generator 26, an increase in the oscillator frequency increases the beat frequency at pin 1 of the one-shot integrated circuit 708 and provides for a decrease in the voltage at terminal 74 of the beat frequency discriminator 68.

Figure 8:
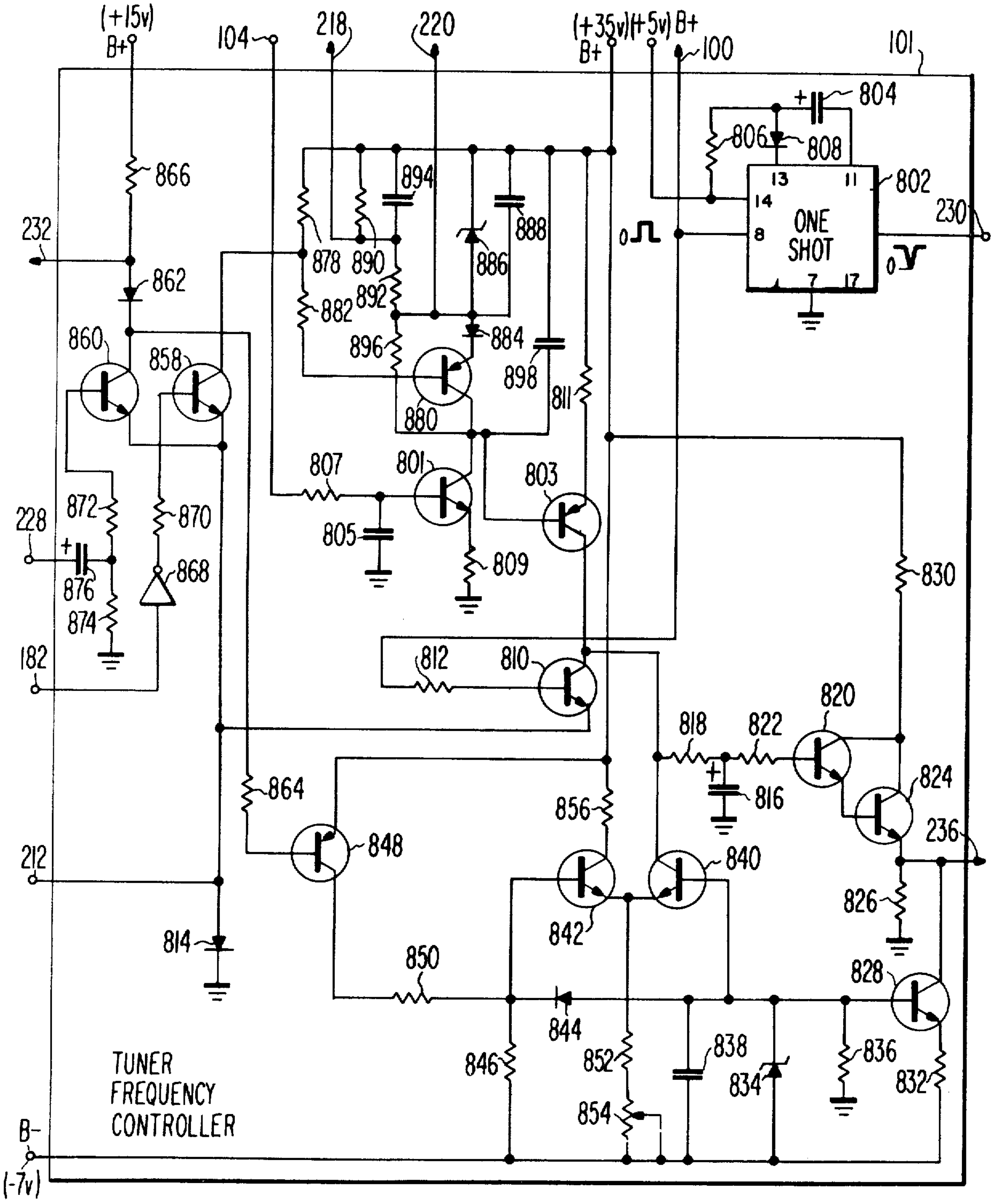
FIG. 8 shows in schematic form a tuner frequency controller suitable for use in the system shown in FIG. 1.

Referring to FIG. 8, the tuner frequency controller 101 provides a voltage at terminal 236 which may be reset to approximately zero volts by means of a reset pulse on terminal 230, swept through a voltage range of approximately zero to 30 volts when particular voltage exists at terminal 182, held at a desirable voltage while providing for minor alterations of voltage level by means of a voltage applied to terminal 104 when a different voltage exists at terminal 182, and change a fixed amount when a particular voltage exists on terminal 228. In addition to the voltage output at terminal 236, a reset voltage is supplied to terminal 100 and a particular voltage is supplied to terminal 232 during a hold condition, while providing a different voltage during scan.

Terminal 230 is coupled to one-shot integrated circuit 802 and provides for an initiation of a pulse of fixed duration at pin 8 of the one-shot integrated circuit 802 in response to a pulse applied to terminal 230. The values of a capacitor 804 and a resistor 806 coupled to integrated circuit 802 determine the duration of the pulse at pin 8 of one-shot integrated circuit 802. The pin 8 of one-shot integrated circuit 802 is coupled to terminal 100 and to the base of a discharge transistor 810. The collector of transistor 810 is coupled to a capacitor 816. The capacitor 816 is also coupled to the base of a transistor 820. The transistor 820 is coupled to a transistor 824 to form a darlington transistor pair. The emitter of transistor 824 is coupled to the terminal 236, and to the collector of a transistor 828 which serves as a constant current source. The base of transistor 828 is coupled to the base of a negative current charging source transistor 840, and to the base of a negative charging source disable transistor 842. The base of transistor 842 is also coupled to the collector of a negative current source defeat driver transistor 848. The collector of transistor 840 is coupled to the collector of transistor 810.

The base of transistor 848 is coupled to the collector of a transistor 858 and the collector of a transistor 860. The base of transistor 858 is coupled to the output terminal of inverting amplifier 868. The input of inverting amplifier 868 is coupled to terminal 182. The base of transistor 860 is coupled to terminal 228. A capacitor 876 and resistors 872 and 874, which provide coupling between terminal 228 and the base of transistor 860, provide for a differentiation of the voltage transition at terminal 238.

The collector of transistor 858 is coupled to the base of an automatic fine tuning defeat transistor 880. The collector of transistor 880 is coupled to the collector of an automatic fine tuning control transistor 801, and to the base of a positive current source transistor 803. The base of transistor 801 is coupled to the terminal 104.

The collector of transistor 803 is coupled to the collector of the discharge transistor 810.

RESET

When a negative pulse having, for example, a four volt reference level occurs at terminal 230, a positive pulse having a zero voltage reference occurs at pin 8 of one-shot integrated circuit 802. This pulse is provided to bandstart latch 97 (FIG. 1) via terminal 100 and to the base of the discharge transistor 810. The resulting base-emitter current in transistor 810 provides for saturation and a collector voltage of approximately 1 volt (voltage drop across diode 814 plus the collector to emitter saturation potential) which provides a path for discharge of capacitor 816 to a voltage of approximately 1 volt. The capacitor 816 preferably is a tantalum capacitor. The one volt charge retained thereon maintains a formed condition of the dielectric and maintains the high charge retention quality of the capacitor. After the period of the pulse at pin 8 of the one-shot integrated circuit 802, the transistor 810 is cut off due to the 0.7 volts on the emitter and approximately zero volts at pin 8 of one-shot integrated circuit 802.

SWEEP

In the sweep mode, the voltage on terminal 182 is approximately zero volts which provides at the output of the inverting amplifier 868 a positive voltage which, via resistor 870, provides for saturation of the transistor 858. With transistor 858 in saturation, the collector voltage is approximately one volt; therefore, the transistor 848 is saturated. with the transistor 848 saturated, the transistor 842 is saturated, which provides an emitter voltage to the transistor 840 which is greater than the base voltage therefore providing for a cutoff of the transistor 840.

In addition, the saturation of the transistor 858 results in a current flow through the base-emitter junction of transistor 880, which provides for saturation of the transistor 880 and a stabilization of the voltage at the base of the transistor 803 and providing for a constant collector current in transistor 803. Since transistor 810 and transistor 840 are cut off, the collector current of transistor 803 flows into the capacitor 816. The voltage that is developed across the capacitor 816 provides a base voltage to the transistor 820, which results in an output voltage at the terminal 236.

Once the capacitor has reached a desired level of charge, the voltage at terminal 182 goes positive, which results in a zero voltage at the output terminal of inverting amplifier 868 and a cutoff of the transistor 858. With transistor 858 cut off, the transistor 880 will be cut off. With transistor 880 cut off, the collector potential of transistor 801 is determined by the voltage on terminal 104. As the automatic fine tuning correction voltage at terminal 104 varies, the collector voltage of transistor 801 also varies, which changes the voltage applied to the base of transistor 803. As the voltage on the base of transistor 803 varies, the collector current is altered, thereby changing the positive charging current coupled to the capacitor 816.

With the transistor 858 cut off, the transistor 848 is cut off; therefore, the voltage at the base of transistor 842 is less than the base voltage at the transistor 840. A voltage is developed at the emitter of transistor 840 which is approximately 0.7 volts less than the voltage on the base of the transistor 840 and which provides for cut off of the transistor 842. With current flowing in the collector of transistor 840, a portion of the collector current of transistor 803 is diverted from capacitor 816.

IMPULSE CHARGING

When a positive voltage is applied to terminal 228, transistor 860 is saturated for a period determined by the resistor 872, the resistor 874 and the capacitor 876. During the period of saturation of the transistor 860, transistor 880 is saturated providing for a fixed collector current in the transistor 803. Also, the transistor 848 and the transistor 842 are saturated, cutting off the negative current source transistor 840. The aforementioned condition provides for a charging of the capacitor 816 to effect a 4 MHz change in the frequency of the VHF oscillator 18, thereby providing for proper conversion of radio frequencies when channel 5 or 6 is selected. Saturation of the transistor 860 also provides for a voltage of approximately 1.7 volts at the terminal 232. Terminal 232 is coupled to beat frequency discriminator 68 (FIG. 1) and provides for a defeating of the IF automatic fine tuning during any change of the charge on the capacitor 816.

The voltages on terminal 218 and terminal 220 provide stable voltages with respect to B+ (+35 volts) for switching transistors in the channel 5 and 6 calibration frequency translator 58.

Figure 9:
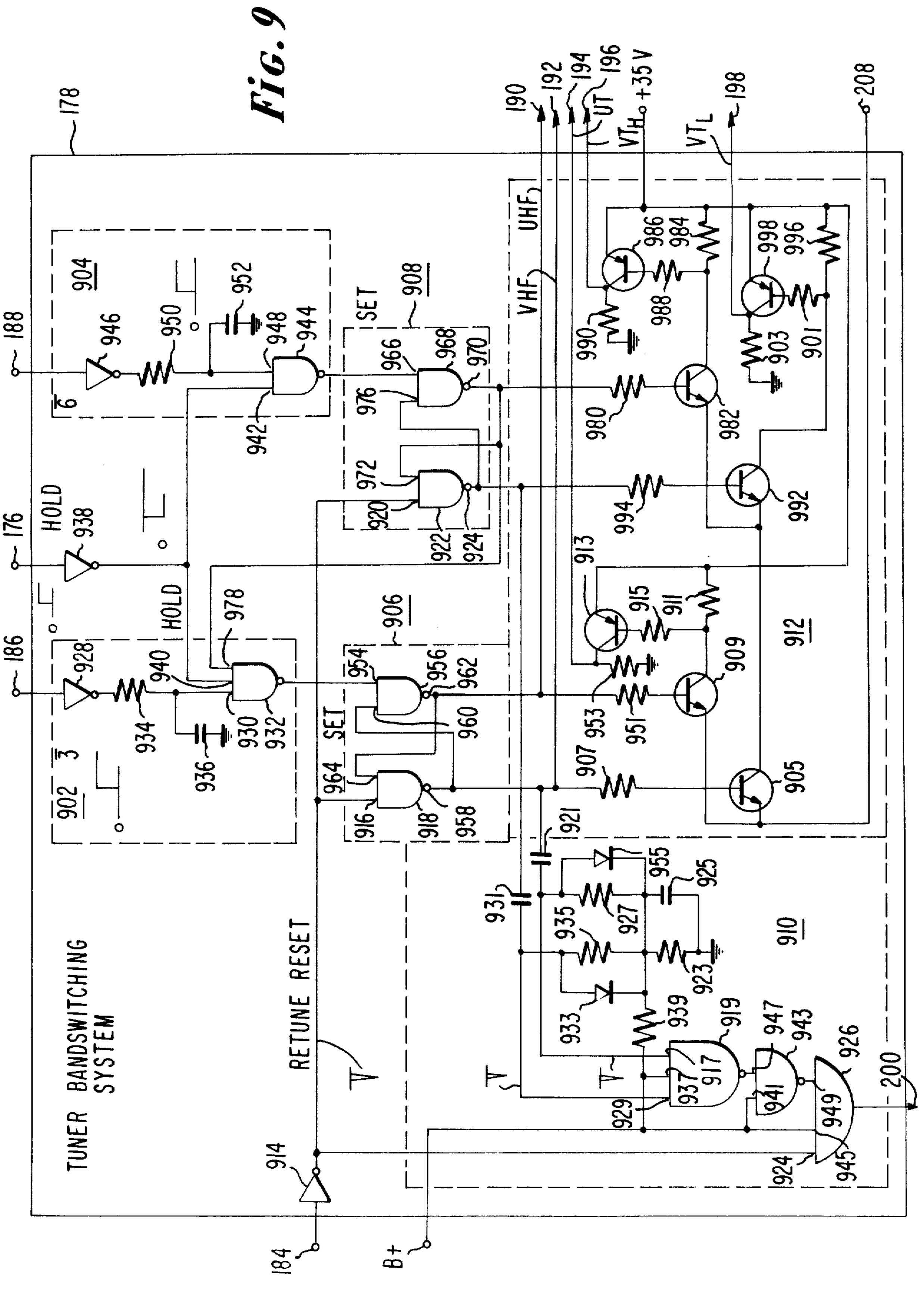
FIG. 9 illustrates in schematic form a tuner bandswitching system suitable for use in the system shown in FIG. 1.

Referring to FIG. 9, tuner bandswitching system 178 comprises a VHF to UHF control circuit 902, a VHF low to VHF high control circuit 904, a VHF-UHF flip-flop 906, a VHF low-VHF high flip-flop 908, a band reset control circuit 910, and a tuner driver network 912.

The output terminals 190 through 198 provide voltages to the VHF tuner 14, UHF tuner 12, the channel 5 and 6 calibration frequency translator 58, and the beat frequency discriminator 68 (FIG. 1). The voltages suplied by terminals 190 through 198 provide for a sequencing through the various radio frequency bands (low band VHF, high band VHF, and UHF), frequency translation of the VHF oscillator signal on channels 5 and 6, and phasing of the IF automatic fine tuning correction signal applied to the one-shot network in the beat frequency discriminator 68. An additional output at terminal 200 provides a band reset pulse to the tuner frequency controller 101 (FIG. 1).

Terminal 184 is coupled to the input of an inverting amplifier 914. The output of inverting amplifier 914 is coupled to an input terminal 916 of a dual input NAND gate 918, to an input terminal 920 of a dual input NAND gate 922, and to an input terminal 924 of a triple input AND gate 926. Terminal 186 is coupled to the input of an inverting amplifier 928. The output of inverting amplifier 928 is coupled to an input terminal 930 of a triple input NAND gate 932 by means of an integrator comprising a resistor 934 and a capacitor 936. The terminal 176 is coupled to the input terminal of inverting amplifier 938. The output terminal of inverting amplifier 938 is coupled to another input terminal 940 of the triple input NAND gate 932, and to an input terminal 942 of dual input NAND gate 944.

Terminal 188 is coupled to the input terminal of an inverting amplifier 946. The output terminal of inverting amplifier 946 is coupled to another input terminal 948 of dual input NAND gate 944 by means of an integrator comprising a resistor 950 and a capacitor 952. The output terminal of triple input NAND gate 932 is coupled to an input terminal 954 of a dual input NAND gate 956. The dual input NAND gate 918 and the dual input NAND gate 956, cross coupled in a manner aforementioned, provide for two stable states at the output terminals 958 and 962.

The output terminal of dual input NAND gate 944 is coupled to an input terminal 966 of dual input NAND gate 968. The dual input NAND gate 922 and the dual input NAND gate 968, cross coupled in the manner aforementioned, provide for two stable states at the output terminals 970 and 974.

The output terminal 970 of dual input NAND gate 968 is coupled to another input terminal 978 of triple input NAND gate 932 and to the base of a high band VHF driver transistor 980. The collector of transistor 982 is coupled to the base of a high band VHF switching transistor 986. The collector of transistor 986 is coupled to the terminal 196. The output terminal 974 of dual input NAND gate 922 is coupled to the base of a low band VHF driver transistor 992. The collector of transistor 992 is coupled to the base of a low band VHF switching transistor 998. The collector of transistor 998 is coupled to terminal 198. The emitter of transistor 982 and the emitter of transistor 992 are coupled to the collector of a VHF switching transistor 905. The base of VHF switching transistor 905 is coupled to the output terminal 958 of dual input NAND gate 918. The emitter of transistor 905 is coupled to terminal 208.

The output terminal 962 of dual input NAND gate 956 is coupled to the base of a UHF driver transistor 909. The emitter of transistor 909 is coupled to terminal 208, and the collector of transistor 909 is coupled to the base of a UHF switching transistor 913. The collector of transistor 913 is coupled to the terminal 194.

The output terminal 958 of dual input NAND gate 918 is also coupled to an input terminal 917 of a triple input NAND gate 919 by means of a differentiator comprising a resistor 927, a diode 955 and a capacitor 921. The output terminal 974 of dual input NAND gate 922 is also coupled to another input terminal 929 of triple input NAND gate 919 by means of a differentiator comprising a resistor 935, a diode 933 and a capacitor 931. Another input terminal 937 of a triple input NAND gate 919 is coupled to B+. The output terminal of NAND gate 919 is coupled to an input terminal of dual input NAND gate 943. Another input terminal 941 of dual input NAND gate 943 and another input terminal 945 of triple input AND gate 926 are also coupled to B+. The output terminal of dual input NAND gate 943 is coupled to another input terminal 949 of triple input AND gate 926. The output terminal of triple input AND gate 926 is coupled to terminal 200.

In operation, a positive retune reset pulse is applied to the terminal 184 and is inverted by the inverting amplifier 914 and provides a negative retune reset pulse having a positive 4 volt reference level to terminal 924 of triple input AND gate 926, terminal 916 of dual input NAND gate 918, and terminal 920 of dual input NAND gate 922. With B+ supply present, terminals 917, 929 and 937 of triple input NAND gate 919 are positive, terminal 941 of dual input NAND gate 943 is positive, and terminal 945 of triple input AND gate 926 is positive. With terminals 917, 929 and 937 of triple input NAND gate 919 positive, terminal 947 of dual input NAND gate 943 is at approximately zero volts and terminal 949 of triple input AND gate 926 is positive, making the voltage at terminal 200 responsive to the negative pulse being applied to terminal 924 of triple input AND gate 926.

The negative pulse applied to terminal 916 of dual input NAND gate 918 makes the terminal 958 go positive. Assuming a positive voltage on terminal 186, the voltage at terminal 930 of triple input NAND gate 932 is approximately zero volts and the terminal 954 of dual input NAND gate 956 is positive. With a positive voltage on terminal 954 of dual input NAND gate 956, the voltage at terminal 962 of dual input NAND gate 956 is at approximately zero volts. With zero volts on terminal 962, the voltage at terminal 958 of dual input NAND gate 918 remains at a positive voltage independent of the voltage on terminal 916. With a positive voltage on terminal 958, the transistor 905 is swithched on and a positive voltage is supplied to terminal 192.

With a negative pulse on terminal 920 of dual input NAND gate 922, the voltage at terminal 947 goes positive. With a positive voltage at terminal 188, there is a voltage of approximately zero at terminal 948 of dual input NAND gate 944; therefore, there is a positive voltage on terminal 966 of dual input NAND gate 968. With a positive voltage on terminal 966 of dual input NAND gate 968, there is a voltage of approximately zero on terminal 970 of dual input NAND gate 968. With zero voltage on terminal 970, the voltage on terminal 974 is positive and is independent of the voltage applied to terminal 920. With a positive voltage on terminal 974, the transistor 992 is saturated and operates in conjunction with the transistor 905 to provide base-emitter current to the transistor 998 which causes saturation of transistor 998. With transistor 998 saturated, voltage at terminal 198 is approximately B+ (+35 volts).

With zero volts at terminal 962, the transistor 907 is cut off and the transistor 913 is cut off. Therefore, the voltage at terminal 194 is approximately zero. Also with the voltage at terminal 970 equal to approximately zero, the transistor 982 is cut off and the transistor 986 is cut off. Therefore, the voltage at terminal 196 is approximately zero.

With a positive voltage at terminal 186 and terminal 188, the voltage at terminal 176 has no effect on the voltages at terminals 190 through 198.

LOW VHF TO HIGH VHF BANDSWITCHING

When the voltage on terminal 188 is approximately zero volts prior to or coincident with zero voltage at the terminal 176, the voltage at terminal 942 and the voltage at terminal 948 of dual input NAND gate 944 go positive and the voltage at terminal 966 goes to approximately zero volts. With a zero voltage on terminal 966 of dual input NAND gate 968, the voltage at terminal 970 of dual input NAND gate 968 goes positive. Since the voltage at terminal 920 of dual input NAND gate 922 is positive, since the retune reset pulse is no longer existent, the voltage at terminal 974 of dual input NAND gate 922 goes to approximately zero volts. With a positive voltage on terminal 970 of dual input NAND gate 968, the transistor 982 is saturated and the transistor 986 is saturated. With transistor 986 saturated, the voltage at terminal 196 is equal to B+ (+35 volts). With zero volts on terminal 974, the transistor 992 and the transistor 998 are cut off. When the voltage at terminal 974 goes to approximately zero volts, a negative pulse is applied to terminal 929 of triple input NAND gate 919 by means of the differentiator comprised of capacitor 931, diode 933 and resistor 935. The negative pulse applied to terminal 929 causes the voltage at terminal 947 to go positive, the voltage at terminal 949 to go negative, and the voltage at terminal 200 to go negative also.

VHF TO UHF BANDSWITCHING

When the voltage at terminal 186 goes to approximately zero volts prior to or coincident with the voltage at terminal 176 going to zero volts, the voltage on terminal 930 and terminal 940 of triple input NAND gate 932 goes positive. With a positive voltage on terminal 970 of dual input NAND gate 968, the voltage at terminal 978 of triple input NAND gate 932 is positive. With a positive voltage on terminals 930, 940 and 978 of triple input NAND gate 932, the voltage at terminal 954 of dual input NAND gate 956 goes to approximately zero volts. With zero volts applied to terminal 954, the voltage at terminal 962 of dual input NAND gate 956 goes positive. With a positive voltage on terminal 916, the voltage at terminal 958 goes to approximately zero. With a positive voltage on terminal 962, transistor 909 and the transistor 913 are saturated. With transistor 913 saturated, the voltage at terminal 194 is approximately B+. With zero volts on terminal 958, transistor 905 is cut off, and the voltage at terminal 196 and terminal 198 is approximately zero volts. When the voltage at terminal 958 goes to approximately zero volts, a negative pulse is applied to terminal 917 of triple input NAND gate 919 by means of the differentiator comprising the capacitor 921, the resistor 927, and the diode 921. With a negative pulse on terminal 917, a positive pulse occurs at terminal 947 of dual input NAND gate 943, a negative pulse is applied to terminal 949 of triple input AND gate 926, and a negative pulse occurs at terminal 200.

One particular configuration corresponding to that illustrated in FIGS. 1–9 is set forth below in terms of component types.

| | | |
|---|---|---|
| Voltage Comparator Amplifier 428 | UA710 | Fairchild |
| Audio Limiter-Detector Amplifier 662 | CA3043 | RCA |
| Voltage Comparator Amplifier 696 | UA710 | Fairchild |
| One Shot 708 | 9601 | Fairchild |
| Voltage Comparator Amplifier 714 | UA710 | Fairchild |
| One Shot 802 | 9601 | Fairchild |

What is claimed is:

1. A television tuning system comprising:

tuning means for receiving radio frequency signals corresponding to any one of a plurality of television channels in at least first and second bands of frequencies and having tunable local oscillator means for producing a corresponding oscillator signal in at least fourth and fifth bands of frequencies;

sweep generator means coupled to said oscillator means for varying the tuning thereof in a predetermined manner through at least said fourth and fifth bands of frequencies;

signal generating means for producing reference signals at frequencies corresponding to television channel oscillator frequencies in said fourth and fifth bands;

frequency discriminator means having first and second inputs coupled to said oscillator means and to said signal generating means, respectively, for producing an output signal representative of frequency differences between said oscillator signal and each of said reference signals as said tuning is varied;

counting means coupled to said discriminator means for producing an output count representative of said oscillator signal passing through a predetermined frequency relationship with respect to each of said reference signals;

channel selector means having an output terminal for producing at said output terminal a stored count representative of a selected television channel;

comparator means coupled to said counting means and to said channel selector means for providing a hold signal to said sweep generator means in response to a match between said output count and said stored count;

decoder means coupled to said counting means for identifying the presence of a particular output count;

bandswitch means for producing a band selection signal to condition said tuning means for reception of said first band of radio frequencies when said output count is less than or equal to said particular count and to condition said tuning means for reception of said second band of radio frequencies when said output count is greater than said particular count; and means for resetting said sweep generator means, in response to a match between said output count and said particular count and the absence of said hold signal, to a condition suitable for initiating variation of the tuning of said oscillator means through said fifth band of frequencies.

2. The combination as in claim 1 wherein said reference signals are produced at frequencies which have said predetermined frequency relationship with corresponding oscillator signals in at least said fourth and fifth bands of frequencies.

3. The combination as in claim 2 wherein said signal generating means comprises a reference oscillator for producing a base reference frequency and each of said reference signals are at harmonics of said base reference frequency.

4. The combination as in claim 3 wherein said base reference frequency is equal to the frequency difference between adjacent ones of said channels.

5. The combination as in claim 4 wherein said base reference frequency is six megahertz.

6. The combination as in claim 2 wherein said predetermined frequency relationship is a positive difference in frequency between said reference frequency and said local oscillator frequency in said fourth band of frequencies and a positive difference in frequency between said local oscillator frequency and said reference frequency in said fifth band of frequencies.

7. The combination as in claim 6 wherein said tuning means is voltage tunable and said sweep generator means provides a voltage for varying the tuning of said oscillator.

8. The combination as in claim 7 wherein said voltage for varying the tuning changes substantially linearly when said sweep generator is varying the tuning of said oscillator means.

9. The combination as in claim 1 wherein said frequency discriminator means comprises:

mixing means coupled to said first and second inputs for providing a frequency difference signal from said oscillator signal and said harmonically related signals;

frequency sensitive means for producing said output signal of a first level when said frequency difference signals are greater than a predetermined frequency range and of a second level when said frequency difference signals are less than said predetermined frequency range; and filter means for coupling a band of said frequency difference signals to said frequency sensitive means.

10. The combination as in claim 9 wherein said predetermined frequency range of said frequency sensitive means includes said predetermined frequency relationship.

11. The combination as in claim 10 wherein said predetermined frequency relationship is substantially one megahertz.

12. The combination as in claim 9 wherein said band of said frequency difference signals is between zero and less than half of the minimum frequency separation between said reference signals of said signal generating means.

13. The combination as in claim 12 wherein said band of said frequency difference signals is zero to less than three megahertz.

14. The combination as in claim 9 wherein said frequency discriminating means further comprises inverting means for producing said output signal of a first level when said frequency difference signal is less than said predetermined frequency range and of a second level when said frequency difference signals are greater than said predetermined frequency range.

15. The combination as in claim 14 wherein said inverting means produces said output signal of said frequency discriminator means in response to a match between said output count and said particular count and the absence of said hold signal.

16. The combination as in claim 1 wherein said counting means comprises means for resetting said output count to an initial output count in response to a change of said stored count.

17. The combination as in claim 16 wherein said initial output count is zero.

18. The combination as in claim 1 wherein said first band of frequencies comprises television low band very high frequencies and said second band of frequencies comprises television high band very high frequencies.

19. The combination as in claim 18 wherein said particular output count of said decoder is six.

20. The combination as in claim 1 wherein said first band of frequencies comprises television very high frequencies and said second band of frequencies comprises television ultra high frequencies.

21. The combination as in claim 20 wherein said particular output count of said decoder is thirteen.

22. A television tuning system comprising:

tuning means for receiving radio frequency signals corresponding to any one of a plurality of television channels in at least first, second and third bands of frequencies and having tunable local oscillator means for producing a corresponding oscillator signal in at least fourth, fifth and sixth bands of frequencies;

sweep generator means coupled to said oscillator means for varying the tuning thereof in a predetermined manner through at least said fourth, fifth and sixth bands of frequencies;

signal generating means for producing reference signals at frequencies corresponding to television channel oscillator frequencies in at least said fourth, fifth and sixth bands, said reference signals being harmonically related;

frequency discriminator means having first and second inputs coupled to said oscillator means and to said signal generating means, respectively, for producing an output signal representative of frequency differences between said oscillator signal and each of said reference signals as said tuning is varied;

counting means coupled to said discriminator means for producing an output count representative of said oscillator signal passing through a predetermined frequency relationship with respect to each of said reference signals;

channel selector means having an output terminal for producing at said output terminal a stored count representative of a selected television channel;

comparator means coupled to said counting means and to said channel selector means for providing a hold signal to said sweep generator means in response to a match between said output count and said stored count;

decoder means coupled to said counting means for identifying the presence of a first and a second particular output count;

bandswitch means for producing a first and a second hand selection signal to condition said tuning means for reception of said first band of radio frequencies when said output count is less than or equal to said first particular count and to condition said tuning means for reception of said second band of radio frequencies when said output count is greater than said first particular count, to condition said tuning means for reception of said fifth band of radio frequencies when said output count is greater than said second particular count; and means for resetting said sweep generator means, in response to a match between said output count and either said first or said second particular count and the absence of said hold signal, to a condition suitable for initiating variation of the tuning of said oscillator means through said fifth or said sixth band of frequencies, respectively.

23. The combination as in claim 22 wherein said reference signals are produced at frequencies which have said predetermined frequency relationship with said corresponding oscillator signals in at least said fourth, fifth and sixth bands of frequencies.

24. The combination as in claim 23 wherein said reference generating means comprises a reference oscillator for producing a base reference frequency and each of said reference signals are at harmonics of said base reference frequency.

25. The combination as in claim 24 wherein said base reference frequency is equal to a frequency difference between adjacent ones of said channels.

26. The combination as in claim 25 wherein said base reference frequency is six megahertz.

27. The combination as in claim 23 wherein said predetermined frequency relationship is a positive difference in frequency between said reference frequency and said oscillator frequency in said fourth and fifth bands of frequencies and a positive difference in frequency between said oscillator frequency and said reference frequency in said sixth band of frequencies.

28. The combination as in claim 27 wherein said tuning means is voltage tunable and said sweep generator means provides a voltage for varying the tuning of said oscillator.

29. The combination as in claim 28 wherein said voltage for varying the tuning changes substantially linearly when said sweep generator means is varying the tuning of said oscillator means.

30. The combination as in claim 22 wherein said frequency discriminator means comprises:

mixing means coupled to said first and second inputs for providing a frequency difference signal from said oscillator signal and said harmonically related reference signals;

frequency sensitive means for producing said output signal of a first level when said frequency difference signals are greater than a predetermined frequency range and of a second level when said frequency difference signals are less than said predetermined frequency range; and filter means for coupling a band of said frequency difference signals to said frequency sensitive means.

31. The combination as in claim 30 wherein said predetermined frequency range of said frequency sensitive means includes said predetermined frequency relationship.

32. The combination as in claim 31 wherein said predetermined frequency relationship is one megahertz.

33. The combination as in claim 30 wherein said band of said frequency difference signals is between zero and less than half of the minimum frequency separation between said reference signals of said signal generating means.

34. The combination as in claim 33 wherein said band of said frequency difference signals is zero to less than three megahertz.

35. The combination as in claim 30 wherein said frequency discriminating means further comprises inverting means for producing said output signal of a first level when said frequency difference signal is less than said predetermined frequency range and of a second level when said frequency difference signals are greater than said predetermined frequency range.

36. The combination as in claim 35 wherein said inverting means produces said output signal of said frequency discriminator means in response to a match between said output count and said second particular count and the absence of said hold signal.

37. The combination as in claim 22 wherein said counting means comprises means for resetting said output count to an initial output count in response to a change of said stored count.

38. The combination as in claim 37 wherein said initial output count is zero.

39. The combination as in claim 22 wherein said first band of frequencies comprises television low band very high frequencies, said second band of frequencies comprises television high band very high frequencies, and said third band of frequencies comprises ultra high frequencies.

40. The combination as in claim 39 wherein said first particular output count of said decoder is six and a second particular output count is thirteen.

41. The combination as in claim 22 wherein said frequency discriminator means is further coupled to said bandswitch means to provide for inversion of said output representative of frequency differences when said third band of radio frequencies is selected.

42. The combination as in claim 22 wherein said sweep generator means is further coupled to said frequency discriminator means to provide for varying the tuning of said oscillator means to maintain said predetermined frequency relationship between said oscillator signal and said harmonically related reference signal nearest said oscillator signal.

43. The combination as in claim 22 wherein said frequency discriminator means is further coupled to said tuning means to provide for changes in said predetermined frequency relationship in response to changes in said radio frequency signals.

44. The combination as in claim 22 wherein said sweep generator is further coupled to said frequency discriminator means to provide for disabling effect of changes of said radio frequency signal on said predetermined frequency relationship when said sweep generator is varying said oscillator signal.

* * * * *